United States Patent
Lai et al.

(10) Patent No.: US 11,404,476 B2
(45) Date of Patent: Aug. 2, 2022

(54) BIPOLAR SELECTOR WITH INDEPENDENTLY TUNABLE THRESHOLD VOLTAGES

(71) Applicant: Taiwan Semiconductor Manufacturing Co., Ltd., Hsin-Chu (TW)

(72) Inventors: Sheng-Chih Lai, Hsinchu County (TW); Chung-Te Lin, Tainan (TW); Min Cao, Hsinchu (TW); Randy Osborne, Beaverton, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/230,222

(22) Filed: Apr. 14, 2021

(65) Prior Publication Data

US 2021/0233958 A1 Jul. 29, 2021

Related U.S. Application Data

(63) Continuation of application No. 16/411,706, filed on May 14, 2019, now Pat. No. 10,991,756.

(Continued)

(51) Int. Cl.
*H01L 27/22* (2006.01)
*G11C 11/16* (2006.01)
(Continued)

(52) U.S. Cl.
CPC .......... *H01L 27/224* (2013.01); *G11C 11/161* (2013.01); *G11C 11/1659* (2013.01);
(Continued)

(58) Field of Classification Search
CPC .............. G11C 11/161; G11C 11/1659; G11C 11/1673; G11C 11/1675; H01L 27/224; H01L 43/02; H01L 43/08
(Continued)

(56) References Cited

U.S. PATENT DOCUMENTS 6,130,814 A  10/2000 Sun
6,256,223 B1 * 7/2001 Sun .......................... G11C 11/16
                                                        365/143

(Continued)

OTHER PUBLICATIONS

Yang et al. "Threshold Switching Selector and 1S1R Integration Development for 3D Cross-point STT-MRAM." IEEE Memory Technology Session, published Dec. 6, 2017.
(Continued)

*Primary Examiner* — Son L Mai
(74) *Attorney, Agent, or Firm* — Eschweiler & Potashnik, LLC

(57) ABSTRACT

Various embodiments of the present application are directed towards a bipolar selector having independently tunable threshold voltages, as well as a memory cell comprising the bipolar selector and a memory array comprising the memory cell. In some embodiments, the bipolar selector comprises a first unipolar selector and a second unipolar selector. The first and second unipolar selectors are electrically coupled in parallel with opposite orientations and may, for example, be diodes or some other suitable unipolar selectors. By placing the first and second unipolar selectors in parallel with opposite orientations, the first unipolar selector independently defines a first threshold voltage of the bipolar selector and the second unipolar selector independently defines a second threshold voltage of the bipolar selector. As a result, the first and second threshold voltages can be independently tuned by adjusting parameters of the first and second unipolar selectors.

20 Claims, 15 Drawing Sheets

Related U.S. Application Data

(60) Provisional application No. 62/749,210, filed on Oct. 23, 2018.

(51) Int. Cl.
*H01L 43/02* (2006.01)
*H01L 43/08* (2006.01)

(52) U.S. Cl.
CPC ...... *G11C 11/1673* (2013.01); *G11C 11/1675* (2013.01); *H01L 43/02* (2013.01); *H01L 43/08* (2013.01)

(58) Field of Classification Search
USPC .................................................. 365/158, 163
See application file for complete search history.

(56) References Cited

U.S. PATENT DOCUMENTS

| | | | |
|---|---|---|---|
| 7,035,141 B1 * | 4/2006 | Tripsas | G11C 13/0002 |
| | | | 257/E27.071 |
| 7,683,433 B2 | 3/2010 | Kapoor et al. | |
| 8,514,605 B2 * | 8/2013 | Chen | G11C 11/1675 |
| | | | 365/48 |
| 9,305,644 B2 | 4/2016 | Kellam et al. | |
| 9,818,478 B2 | 11/2017 | Chung | |
| 9,859,333 B2 | 1/2018 | Kim et al. | |
| 9,923,027 B2 | 3/2018 | Chiu et al. | |
| 9,934,851 B2 * | 4/2018 | Kellam | G11C 13/00 |
| 10,249,379 B2 | 4/2019 | Chung | |
| 10,991,756 B2 * | 4/2021 | Lai | H01L 43/08 |
| 2009/0180310 A1 | 7/2009 | Shimomura et al. | |
| 2012/0044736 A1 | 2/2012 | Chung | |
| 2012/0044747 A1 | 2/2012 | Chung | |
| 2012/0063192 A1 | 3/2012 | Lee | |
| 2012/0075906 A1 | 3/2012 | Ho et al. | |
| 2018/0174650 A1 | 6/2018 | Chung | |

OTHER PUBLICATIONS

U.S. Appl. No. 16/531,482, filed Aug. 5, 2019.
Non-Final Office Action dated Apr. 7, 2020 for U.S. Appl. No. 16/411,706.
Final Office Action dated Sep. 17, 2020 for U.S. Appl. No. 16/411,706.
Notice of Allowance dated Dec. 18, 2020 for U.S. Appl. No. 16/411,706.

* cited by examiner

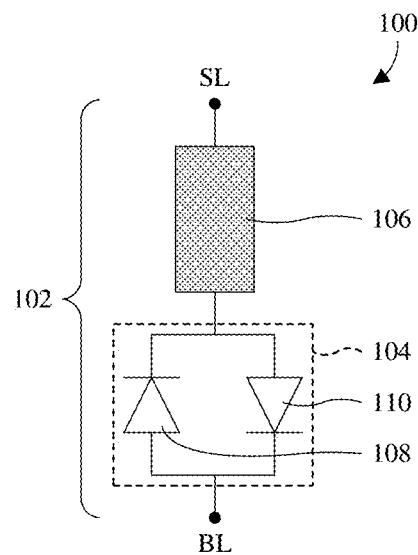
Fig. 1
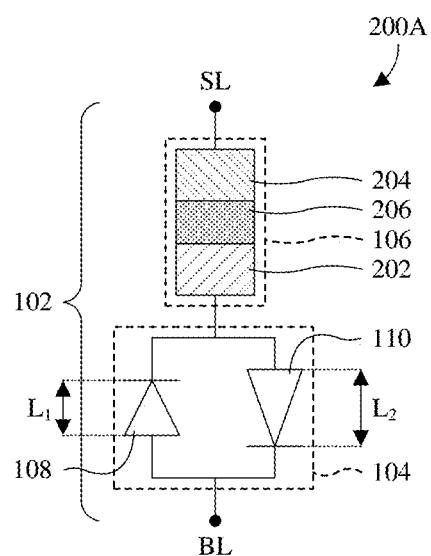 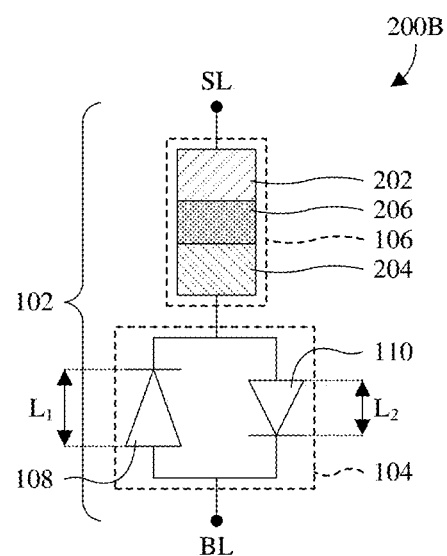
Fig. 2A     Fig. 2B

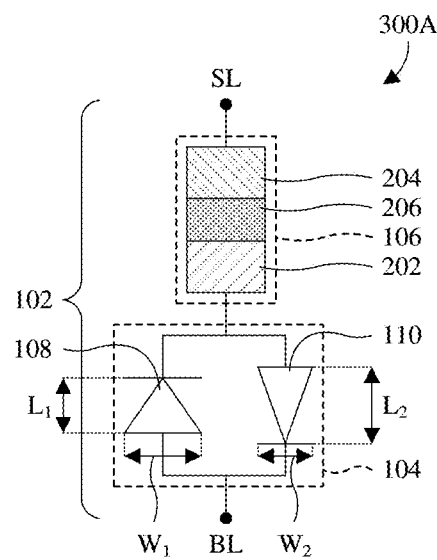
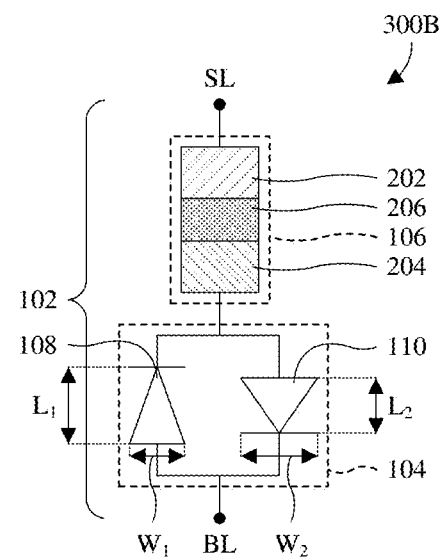
Fig. 3A  Fig. 3B
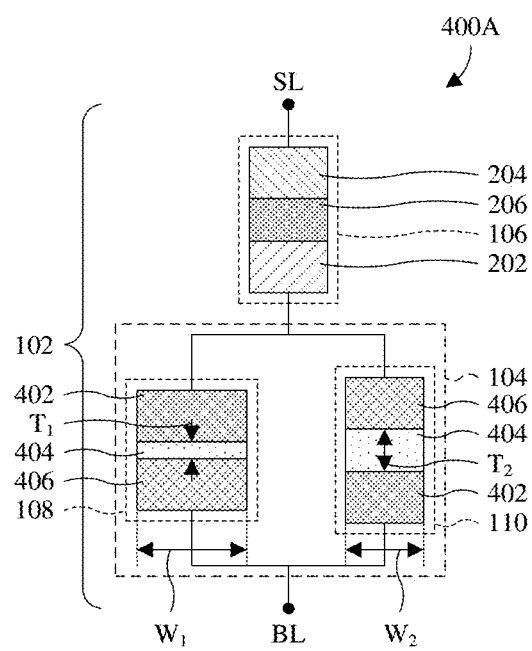
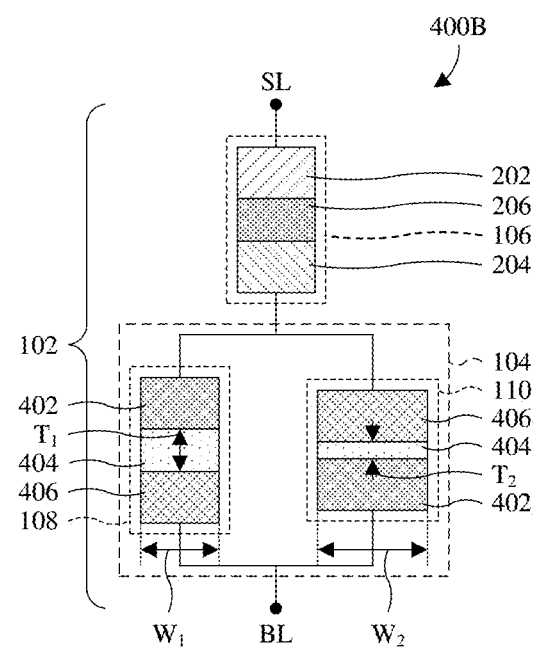
Fig. 4A  Fig. 4B

BIPOLAR SELECTOR WITH INDEPENDENTLY TUNABLE THRESHOLD VOLTAGES

REFERENCE TO RELATED APPLICATIONS

This Application is a Continuation of U.S. application Ser. No. 16/411,706, filed on May 14, 2019, which claims the benefit of U.S. Provisional Application No. 62/749,210, filed on Oct. 23, 2018. The contents of the above-referenced applications are hereby incorporated by reference in their entirety.

BACKGROUND

Many modern-day electronic devices include electronic memory. A cross-point memory architecture with one-selector one-resistor (1S1R) memory cells is increasingly receiving attention for use with next generation electronic memory due to its high density. Examples of next generation electronic memory include resistive random-access memory (RRAM), phase-change random-access memory (PCRAM), magnetoresistive random-access memory (MRAM), and conductive-bridging random-access memory (CBRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a schematic diagram of some embodiments of a memory cell comprising a bipolar selector with independently tunable threshold voltages.

FIGS. 2A and 2B illustrate schematic diagrams of various more detailed embodiments of the memory cell of FIG. 1 in which a data-storage element of the memory cell is a magnetic tunnel junction (MTJ).

FIGS. 3A and 3B illustrate schematic diagrams of some alternative embodiments of the memory cells respectively of FIGS. 2A and 2B in which individual selectors of the bipolar selector have different sizes.

FIGS. 4A and 4B illustrate schematic diagrams of some more detailed embodiments of the memory cells respectively of FIGS. 3A and 3B in which the individual selectors of the bipolar selector are multilayer stacks.

DETAILED DESCRIPTION

Figure 5:
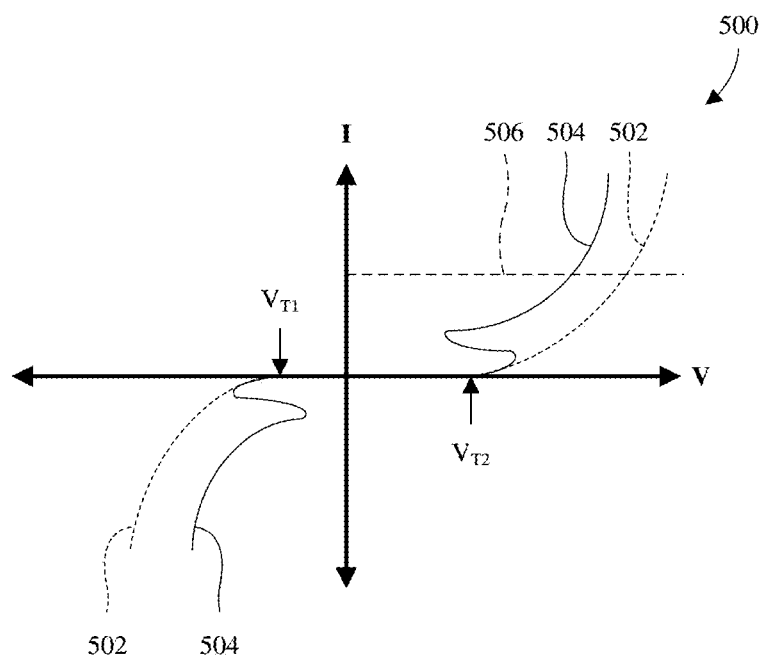
FIG. 5 illustrates a graph of some embodiments of current-voltage (I-V) curves for the bipolar selector of FIG. 1.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cross-point memory array may, for example, comprise multiple one-selector one-resistor (1S1R) memory cells respectively at cross points of bit lines and word lines. By appropriately biasing a bit line and a word line, a 1S1R memory cell at a cross point of the bit and word lines is selected and current flows through the 1S1R memory cell. When a 1S1R memory cell is selected, a selector of the 1S1R memory cell is biased with a voltage greater than a threshold voltage of the selector. Further, selectors of unselected memory cells at a bit line of the 1S1R memory cell and selectors of unselected memory cells at a word line of the 1S1R memory cell are biased since the bit line and the word line are shared. However, voltages across the selectors of the unselected memory cells are less than threshold voltages of the selectors, whereby current does not flow through the other 1S1R memory cells.

The 1S1R memory cells may be unipolar or bipolar. A unipolar 1S1R memory cell is read from and written to at a single polarity. A bipolar 1S1R memory cell is read from and/or written to at two polarities. For example, a bipolar 1S1R memory cell may be set to different states respectively at different polarities. Therefore, selectors for unipolar 1S1R memory cells (i.e., unipolar selectors) switch at a single polarity and/or have a single threshold voltage, and selectors for bipolar 1S1R memory cells (i.e., bipolar selectors) switch at two polarities and/or have multiple threshold voltages respectively at the two polarities.

Bipolar selectors typically have symmetrical threshold voltages. A symmetrical threshold voltage has a similar value at a first polarity as at a second polarity and cannot be tuned for one polarity without similar tuning for the other polarity. However, bias voltages used at a first polarity may be different than bias voltages used at a second polarity, whereby it may be difficult to properly match a symmetrical threshold voltage to the bias voltages at both the first polarity and the second polarity. Due to a poorly matching threshold voltage, unselected 1S1R memory cells sharing a bit or word line with a selected 1S1R memory cell may have selectors that are not fully OFF. As a result, leakage current may flow through the unselected 1S1R memory cells and cause a read disturbance and/or a write disturbance. Further, due to a poorly matching threshold voltage, a selected 1S1R memory cell may have a selector that is not fully ON. As a result, the selector may cause a high amount of parasitic resistance in the selected 1S1R memory cell that causes a read disturbance. A read disturbance may reduce a read window of a selected 1S1R memory cell and/or may cause read failure. A write disturbance may cause a state of an unselected 1S1R memory cell to change.

Various embodiments of the present application are directed towards a bipolar selector having independently tunable threshold voltages, as well as a memory cell comprising the bipolar selector and a memory array comprising the memory cell. In some embodiments, the bipolar selector comprises a first unipolar selector and a second unipolar selector. A unipolar selector may, for example, that switches at a single polarity and/or has a single threshold voltage, whereas a bipolar selector may, for example, be a selector that switches at multiple polarities and/or has multiple threshold voltages respectively at the multiple polarities. The first and second unipolar selectors are electrically coupled in parallel with opposite orientations and may, for example, be diodes or some other suitable unipolar selectors.

By placing the first and second unipolar selectors in parallel with opposite orientations, the first unipolar selector independently defines a first threshold voltage of the bipolar selector and the second unipolar selector independently defines a second threshold voltage of the bipolar selector. As a result, the first and second threshold voltages can be independently tuned by adjusting parameters of the first and second unipolar selectors. The independent tuning allows the first and second threshold voltages to be better matched to bias conditions for reading from and/or writing to the memory cell when the polarity of the memory cell changes between read and/or write operations. By better matching the bias conditions, read disturbance and/or write disturbance may be reduced.

With reference to FIG. 1, a schematic diagram 100 of some embodiments of a memory cell 102 comprising a bipolar selector 104 with independently tunable threshold voltages is provided. The bipolar selector 104 is electrically coupled in series with a data-storage element 106, from a bit line BL to a source line SL. In some embodiments, locations of the bit line BL and the source line SL are reversed. Further, the bipolar selector 104 has a first threshold voltage at a first polarity, and further has a second threshold voltage at a second polarity. In some embodiments, the first and second threshold voltages are different. For example, the first threshold voltage may be 5V, whereas the second threshold voltage may be 4V, or vice versa. Other values are, however, amenable for the first and second threshold voltages. In other embodiments, the first and second threshold voltages are the same.

The bipolar selector 104 is at the first polarity when the voltage across the bipolar selector 104 is positive from the bit line BL to the data-storage element 106, whereas the bipolar selector 104 is at the second polarity when the voltage across the bipolar selector 104 is positive from the data-storage element 106 to the bit line BL. At the first polarity, the bipolar selector 104 conducts and/or is in a low resistance state if the voltage across the bipolar selector 104, from the bit line BL to the data-storage element 106, exceeds the first threshold voltage. Otherwise, at the first polarity, the bipolar selector 104 is non-conducting and/or is in a high resistance state. At the second polarity, the bipolar selector 104 conducts and/or is in a low resistance state if the voltage across the bipolar selector 104, from the data-storage element 106 to the bit line BL, exceeds the second threshold voltage. Otherwise, at the second polarity, the bipolar selector 104 is non-conducting and/or is in a high resistance state.

The bipolar selector 104 comprises a first unipolar selector 108 and a second unipolar selector 110. The first and second unipolar selectors 108, 110 are electrically coupled in parallel with opposite directions. A unipolar selector is a device that switches at a single polarity and/or has a single threshold voltage. At a first polarity, the unipolar selector conducts and/or is in a low resistance state if the voltage across the unipolar selector exceeds a threshold voltage. Otherwise, at the first polarity, the unipolar selector is non-conducting and/or is in a high resistance state. At the second polarity, the unipolar selector is non-conducting and/or in a high resistance state. The first and second unipolar selectors 108, 110 may, for example, have opposite directions in that the first unipolar selector 108 is configured to selectively allow current to flow in a first direction while blocking the flow of current in a second direction, whereas the second unipolar selector 110 is configured to selectively allow current to flow in the second direction while blocking the flow of current in the first direction. The first and second unipolar selectors 108, 110 may, for example, be PIN diodes, polysilicon diodes, punch-through diodes, varistor-type selectors, ovonic threshold switches (OTSs), doped-chalcogenide-based selectors, Mott effect based selectors, mixed-ionic-electronic-conductive (MIEC)-based selectors, field-assisted-superliner-threshold (FAST) selectors, filament-based selectors, doped-hafnium-oxide-based selectors, or some other suitable diodes and/or selectors.

By placing the first and second unipolar selectors 108, 110 in parallel with opposite directions, the first unipolar selector 108 independently defines the first threshold voltage and the second unipolar selector 110 independently defines the second threshold voltage. As a result, the first and second threshold voltages can be independently tuned by adjusting parameters of the first and second unipolar selectors 108, 110. The independent tuning allows the first and second threshold voltages to be better matched to bias conditions for reading from and/or writing to the memory cell 102 when the polarity of the memory cell 102 changes between read and/or write operations. By better matching the bias conditions, read disturbance may be reduced while reading the memory cell 102. Further, write disturbance to neighboring memory cells (not shown) may be reduced while reading from and/or writing to the memory cell 102.

In some embodiments, the first unipolar selector 108 has only two terminals and/or the second unipolar selector 110 has only two terminals. In some embodiments, the first unipolar selector 108 has more than two terminals and/or the second unipolar selector 110 has more than two terminals. In some embodiments (e.g., where the first and second unipolar selectors 108, 110 are diodes), a cathode of the first unipolar selector 108 is electrically coupled to an anode of the second unipolar selector 110 and an anode of the first unipolar selector 108 is electrically coupled to a cathode of the second unipolar selector 110. In alternative embodiments, bipolar selectors and/or some other suitable type of selectors are used in place of unipolar selectors for the first and second unipolar selectors 108, 110.

The data-storage element 106 stores a bit of data. In some embodiments, a resistance of the data-storage element varies depending upon a data state of the data-storage element 106. For example, the data-storage element 106 may have a low resistance at a first data state and may have a high resistance at a second data state. In other embodiments, capacitance or some other suitable parameter of the data-storage element 106 varies depending upon a data state of the data-storage element 106. In some embodiments, the data-storage element 106 is a magnetic tunnel junction (MTJ) or some other suitable magnetic junction and/or the memory cell 102 is a spin-transfer torque magnetic random-access memory (STT-MRAM) cell or some other suitable MRAM cell. In some embodiments, the data-storage element 106 is a metal-insulator-metal (MIM) stack and/or the memory cell 102 is a resistance random-access memory (RRAM) cell. Other structures for the data-storage element 106 and/or other memory-cell types for the memory cell 102 are, however, amenable.

In some embodiments, the data-storage element 106 is set to a first data state at the first polarity and is set to a second data state at the second polarity, such that writing to the data-storage element 106 is bipolar. For example, where the data-storage element 106 is an MTJ, the data-storage element 106 may be set to a first data state at the first polarity and may be set to a second data state at the second polarity. Accordingly, the first threshold voltage is used while setting the data-storage element 106 to the first data state, whereas the second threshold voltage is used while setting the data-storage element 106 to the second data state. In some embodiments, the data-storage element 106 is read from at the first polarity, such that reading from the data-storage element 106 is unipolar. Accordingly, only the first threshold voltage is used while reading from the data-storage element 106.

With reference to FIG. 2A, a schematic diagram 200A of some more detailed embodiments of the memory cell 102 of FIG. 1 is provided in which the data-storage element 106 is an MTJ. The data-storage element 106 comprises a reference element 202, a free element 204, and a barrier element 206. The barrier element 206 is non-magnetic and is sandwiched between the reference and free elements 202, 204. The reference and free elements 202, 204 are ferromagnetic, and the free element 204 overlies the reference element 202 and the barrier element 206. Further, the reference element 202 has a fixed magnetization, whereas the free element 204 has variable a magnetization.

Depending upon whether magnetizations of the reference and free elements 202, 204 are parallel or anti-parallel, the data-storage element 106 has a low resistance or a high resistance. For example, the data-storage element 106 may have the low resistance when the magnetizations of the reference and free elements 202, 204 are parallel and may have the high resistance when the magnetizations are anti-parallel. The low and high resistances may, in turn, be used to represent different data states of the data-storage element 106.

A first write voltage is applied across the data-storage element 106 at a first polarity to set the data-storage element 106 to an antiparallel state, and a second write voltage is applied across the data-storage element 106 at a second polarity to set the data-storage element 106 to a parallel state. In some embodiments, the second write voltage is greater than the first write voltage since the data-storage element 106 is typically, but not always, in a high resistance state (i.e., the antiparallel state) when setting the data-storage element 106 to the parallel state. The second write voltage may, for example, be about 1.5-3.0 times greater than the first write voltage. However, other multiples greater than one (e.g., 5.0 or some other value) are amenable. In some embodiments in which the second write voltage is greater than the first write voltage, the second threshold voltage is greater than the first threshold voltage since the first threshold voltage is used at the same polarity as the first write voltage and the second threshold voltage is used at the same polarity as the second write voltage. This may, for example, be schematically illustrated by an increased length $L_2$ of the second unipolar selector 110 compared to a length $L_1$ of the first unipolar selector 108.

In some embodiments, the barrier element 206 is a tunnel barrier selectively allowing quantum mechanical tunneling of electrons through the barrier element 206. For example, quantum mechanical tunneling may be allowed when the reference and free elements 202, 204 have parallel magnetizations, and may be blocked when the reference and free elements 202, 204 have antiparallel magnetizations. The barrier element 206 may, for example, be or comprise an amorphous barrier, a crystalline barrier, or some other suitable barrier. The amorphous barrier may be or comprise, for example, aluminum oxide (e.g., $AlO_x$), titanium oxide (e.g., $TiO_x$), or some other suitable amorphous barrier. The crystalline barrier may be or comprise manganese oxide (e.g., MgO), spinel (e.g., $MgAl_2O_4$), or some other suitable crystalline barrier.

In some embodiments, the reference element 202 is or comprises cobalt iron (e.g., CoFe), cobalt iron boron (e.g., CoFeB), or some other suitable ferromagnetic material(s), or any combination of the foregoing. In some embodiments, the reference element 202 adjoins an antiferromagnetic element (not shown) and/or is part of or otherwise adjoins a synthetic antiferromagnetic (SAF) element (not shown). In some embodiments, the free element 204 is or comprises cobalt iron (e.g., CoFe), cobalt iron boron (e.g., CoFeB), or some other suitable ferromagnetic material(s), or any combination of the foregoing.

With reference to FIG. 2B, a schematic diagram 200B of some alternative embodiments the memory cell 102 of FIG. 2A is provided in which the reference element 202 overlies the free element 204. Since the reference element 202 overlies the free element 204, the polarities at which the first and second write voltages are applied across the data-storage element 106 are reversed compared to FIG. 2A. The first write voltage is applied across the data-storage element 106 at the second polarity to set the data-storage element 106 to the antiparallel state, and the second write voltage is applied across the data-storage element 106 at the first polarity to set the data-storage element 106 to the parallel state. In some embodiments in which the second write voltage is greater than the first write voltage, the first threshold voltage is greater than the second threshold voltage since the first threshold voltage is used at the same polarity as the second write voltage and the second threshold voltage is used at the same polarity as the first write voltage. This may, for example, be schematically illustrated by an increased length $L_1$ of the first unipolar selector 108 compared to the length $L_2$ of the second unipolar selector 110.

With reference to FIG. 3A, a schematic diagram 300A of some alternative embodiments of the memory cell 102 of FIG. 2A is provided in which a size of the first unipolar selector 108 is greater than a size of the second unipolar selector 110. This may, for example, be schematically illustrated by an increased width $W_1$ of the first unipolar selector 108 compared to a width $W_2$ of the second unipolar selector 110. In some embodiments, the first and second unipolar selectors 108, 110 are each formed by a multilayer stack and the size of the first unipolar selector 108 is greater than the size of the second unipolar selector 110 in terms of cross-sectional width of the multilayer stack.

In some embodiments, the first unipolar selector 108 has a lesser ON resistance than an ON resistance of the second unipolar selector 110 due to the greater size. Further, in some embodiments, the first unipolar selector 108 is ON while reading the memory cell 102, whereas the second unipolar selector 110 is OFF while reading the memory cell 102. Hence, the greater size of the first unipolar selector 108 may reduce parasitic resistance while reading the memory cell 102, which enlarges the read window.

With reference to FIG. 3B, a schematic diagram 300B of some alternative embodiments of the memory cell 102 of FIG. 2B is provided in which a size of the second unipolar selector 110 is greater than a size of the first unipolar selector 108. This may, for example, be schematically illustrated by an increased width $W_2$ of the second unipolar selector 110 compared to the width $W_1$ of the first unipolar selector 108. The greater size of the second unipolar selector 110 may, for example, reduce parasitic resistance while reading the memory cell 102, which enlarges the read window and reduces read disturbance.

With reference to FIG. 4A, a schematic diagram 400A of some more detailed embodiments of the memory cell 102 of FIG. 3A is provided in which the first and second unipolar selectors 108, 110 are multilayer stacks. The first and second unipolar selectors 108, 110 comprise individual cathodes 402, individual insulators 404, and individual anodes 406. The insulators 404 are each sandwiched between a respective one of the cathodes 402 and a respective one of the anodes 406. The multilayer stacks may, for example, be or comprise PIN diodes, MIM devices, or some other multilayer devices.

In some embodiments in which the multilayer stacks are PIN diodes, the cathodes 402 are or comprise N-type semiconductor material, the anodes 406 are or comprise P-type semiconductor material, and the insulators 404 are or comprise intrinsic or lightly doped semiconductor material. The insulators 404 may, for example, be lightly doped relative to the cathodes 402 and/or the anodes 406. The semiconductor material of the multilayer stacks may, for example, be or comprises polysilicon, monocrystalline silicon, germanium, indium gallium arsenide, or some other suitable semiconductor material. In some embodiments in which the multilayer stacks are MIM devices, the cathodes 402 and the anodes 406 are or comprise metal or some other suitable conductive material and/or the insulators 404 are or comprise doped hafnium oxide, some other suitable metal oxide, or some other suitable insulator material.

In some embodiments, thicknesses of the insulators 404 are varied to adjust threshold voltages of the first and second unipolar selectors 108, 110. For example, increasing a thickness of an insulator may increase a threshold voltage of the corresponding unipolar selector whereas decreasing the thickness may decrease the threshold voltage. In some embodiments, a second insulator thickness $T_2$ of the second unipolar selector 110 is greater than a first insulator thickness $T_1$ of the first unipolar selector 108 so the second unipolar selector 110 has a greater threshold voltage than the first unipolar selector 108. In some embodiments, doping concentrations of the insulators 404 are varied to adjust threshold voltages of the first and second unipolar selectors 108, 110. For example, increasing a doping concentration of an insulator may decrease a threshold voltage of the corresponding selector whereas decreasing the doping concentration may increase the threshold voltage.

In some embodiments, widths of the of the first and second unipolar selectors 108, 110 are varied to adjust ON resistances of the first and second unipolar selectors 108, 110. For example, increasing a width of a selector may decrease an ON resistance of the selector whereas decreasing the width may increase the ON resistance. In some embodiments, a second width $W_2$ of the second unipolar selector 110 is less than a first width $W_1$ of the first unipolar selector 108 so the first unipolar selector 108 has a lesser ON resistance than the second unipolar selector 110. As noted above, the lesser ON resistance may enlarge the read window for the memory cell 102 when the first unipolar selector 108 is ON during reads.

With reference to FIG. 4B, a schematic diagram 400B of some more detailed embodiments of the memory cell 102 of FIG. 3B is provided in which the first and second unipolar selectors 108, 110 are multilayer stacks. The first and second unipolar selectors 108, 110 comprise individual cathodes 402, individual insulators 404, and individual anodes 406. The cathodes 402, the insulators 404, and the anodes 406 may, for example, be as described above with regard to FIG. 4A. In some embodiments, the first insulator thickness $T_1$ of the first unipolar selector 108 is greater than the second insulator thickness $T_2$ of the second unipolar selector 110 so the first unipolar selector 108 has a greater threshold voltage than the second unipolar selector 110. In some embodiments, the second width $W_2$ of the second unipolar selector 110 is greater than the first width $W_1$ of the first unipolar selector 108 so the second unipolar selector 110 has a lesser ON resistance than the first unipolar selector 108.

With reference to FIG. 5, a graph 500 of some embodiments of current-voltage (I-V) curves for the bipolar selector 104 of FIG. 1 is provided. A horizontal axis of the graph 500 corresponds to voltage, and a vertical axis of the graph 500 corresponds to current. Further, a top-right quadrant of the graph 500 corresponds to a first polarity of the bipolar selector 104, and a bottom-left quadrant of the graph 500 corresponds to a second polarity of the bipolar selector 104. The graph 500 includes a first I-V curve 502 and a second I-V curve 504.

Focusing on the first I-V curve 502, current is about zero until the voltage exceeds a first threshold voltage $V_{T1}$ of the bipolar selector 104 and then increases in magnitude with voltage. Further, current is about zero until the voltage exceeds a second threshold voltage $V_{T2}$ of the bipolar selector 104 and then increases in magnitude with voltage. In some embodiments, the bipolar selector 104 of FIG. 1 has the first I-V curve 502 when the first and second unipolar selectors 108, 110 of FIG. 1 are polysilicon diodes, PIN diodes, or some other suitable type of diode. For example, embodiments of the bipolar selectors 104 in FIGS. 4A and 4B may have the first I-V curve 502 since the first and second unipolar selectors 108, 110 may be PIN diodes.

Focusing on the second I-V curve 504, the second I-V curve 504 has a snapback shape. Current is about zero until the voltage exceeds the first threshold voltage $V_{T1}$ of the bipolar selector 104 and then increases in magnitude. As the current increases in magnitude, the voltage snaps back towards zero volts before increasing in magnitude. Further, current is about zero until the voltage exceeds the second threshold voltage $V_{T2}$ of the bipolar selector 104 and then increases in magnitude. As the current increases in magnitude, the voltage snaps back towards zero volts before increasing in magnitude. In some embodiments, the bipolar selector 104 has the second I-V curve 504 when the first and second unipolar selectors 108, 110 are MIM devices comprising doped-hafnium-oxide insulators. For example, embodiments of the bipolar selector 104 in FIGS. 4A and 4B may have the second I-V curve 504 since the first and second unipolar selectors 108, 110 may be MIM devices comprising doped-hafnium-oxide insulators.

Embodiments of the bipolar selector 104 having the second I-V curve 504 may, for example, have a lesser ON resistance compared to embodiments of the bipolar selector 104 having the first I-V curve 502. For a given current (demarcated by dashed line 506), the second I-V curve 504 has a lesser voltage than the first I-V curve 502 due to the snapback. Hence, by Ohm's law, the resistance across the bipolar selector 104 is less for embodiments of the bipolar selector 104 having the second I-V curve 504 than embodiments of the bipolar selector 104 having the first I-V curve 502. The lesser resistance, in turn, enlarges the read window for the memory cell 102 of FIG. 1 since there is less parasitic resistance.

Regardless of whether the bipolar selector 104 has the first or second I-V curve 502, 504, the first threshold voltage $V_{T1}$ is defined by the first unipolar selector 108 of FIG. 1 and the second threshold voltage $V_{T2}$ is defined by the second unipolar selector 110 of FIG. 1. In some embodiments, the first and second threshold voltages $V_{T1}$, $V_{T2}$ have different magnitudes, such that the bipolar selector 104 has an asymmetric threshold voltage. In some embodiments, the first and second threshold voltages $V_{T1}$, $V_{T2}$ have the same magnitude, such that the bipolar selector 104 has a symmetric threshold voltage.

Figure 6A:
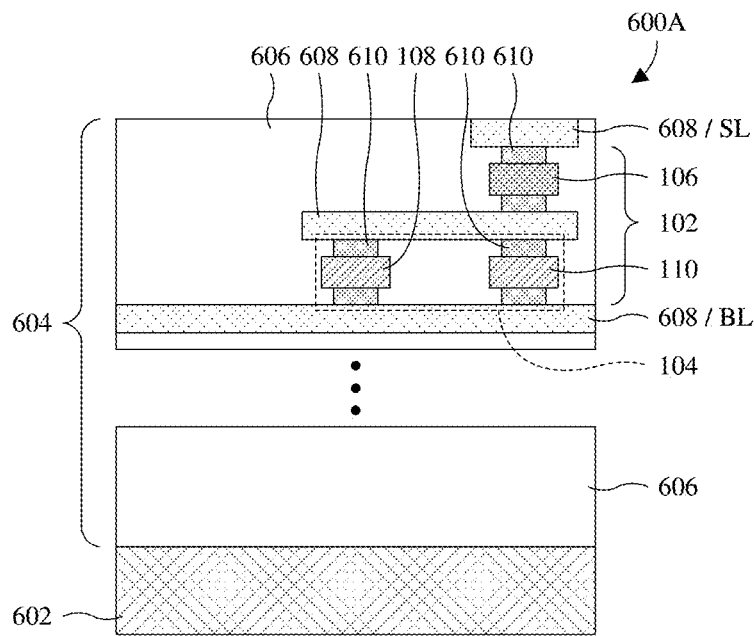
FIGS. 6A and 6B illustrate cross-sectional views of various embodiments of an integrated chip comprising the memory cell of FIG. 1.

With reference to FIG. 6A, a cross-sectional view 600A of some embodiments of an integrated chip comprising the memory cell 102 of FIG. 1 is provided. The memory cell 102 overlies a substrate 602 and is located within an interconnect structure 604 that covers the substrate 602. The interconnect structure 604 comprises an interconnect dielectric layer 606, a plurality of wires 608, and a plurality of vias 610. For ease of illustration, only some of the vias 610 are labeled 610. The interconnect dielectric layer 606 accommodates the wires 608, the vias 610, and the memory cell 102 and may, for example, be or comprise silicon oxide, a low κ dielectric, some other suitable dielectric(s), or any combination of the foregoing. As used herein, a low κ dielectric may be, for example, a dielectric with a dielectric constant κ less than about 3.9, 3, 2, or 1.

The wires 608 and the vias 610 are alternatingly stacked in the interconnect dielectric layer 606 to define conductive paths interconnecting components of the memory cell 102 and/or connecting the memory cell 102 to other devices (not shown) in the integrated chip. For example, the wires 608 and the vias 610 may define conductive paths electrically coupling the first and second unipolar selectors 108, 110 in parallel. As another example, the wires 608 and the vias 610 may define conductive paths electrically coupling the bipolar selector 104 in series with the data-storage element 106 from a wire defining the bit line BL to a wire defining the source line SL. The wires 608 and the vias 610 may, for example, be or comprise metal, some other suitable conductive material(s), or any combination of the foregoing.

Figure 6B:
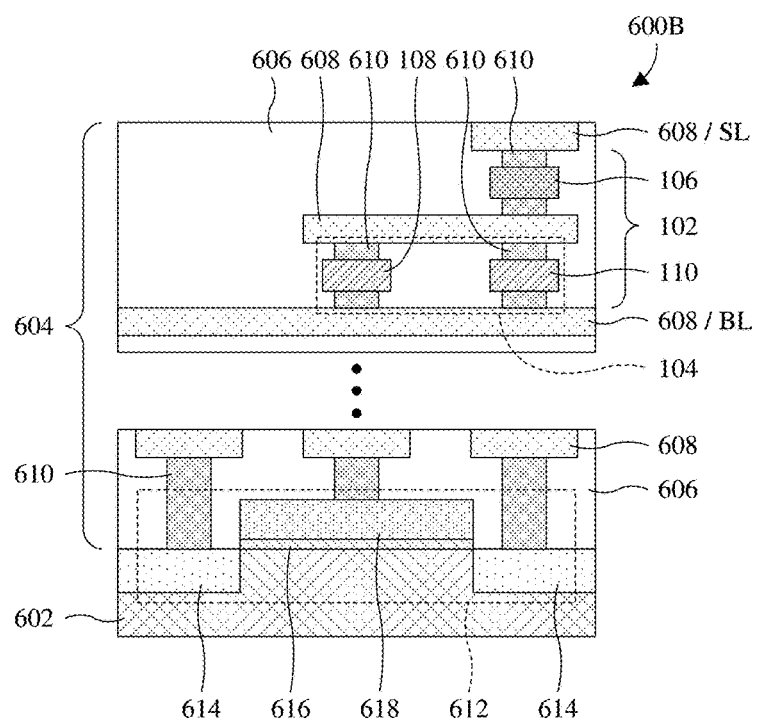

With reference to FIG. 6B, a cross-sectional view 600B of some alternative embodiments of the integrated chip of FIG. 6A is provided in which a semiconductor device 612 underlies the memory cell 102. Arranging the semiconductor device 612 under the memory cell 102 may, for example, enhance a functional density of the integrated chip. In some embodiments, the semiconductor device 612 is electrically separate from the memory cell 102 and/or the wires 608 and the vias 610 do not define a conductive path directly from the semiconductor device 612 to the memory cell 102. In other embodiments, the semiconductor device 612 is electrically coupled to the memory cell 102 by the wires 608 and the vias 610. The semiconductor device 612 may, for example, be a metal-oxide-semiconductor (MOS) device, an insulated-gate field-effect transistor (IGFET), or some other suitable semiconductor device.

In some embodiments, the semiconductor device 612 comprises a pair of source/drain regions 614, a gate dielectric layer 616, and a gate electrode 618. The source/drain regions 614 are in the substrate 602, along a top surface of the substrate 602. The gate dielectric layer 616 and the gate electrode 618 are stacked over the substrate 602, vertically between the substrate 602 and the interconnect structure 604 and laterally between the source/drain regions 614.

Figure 7:
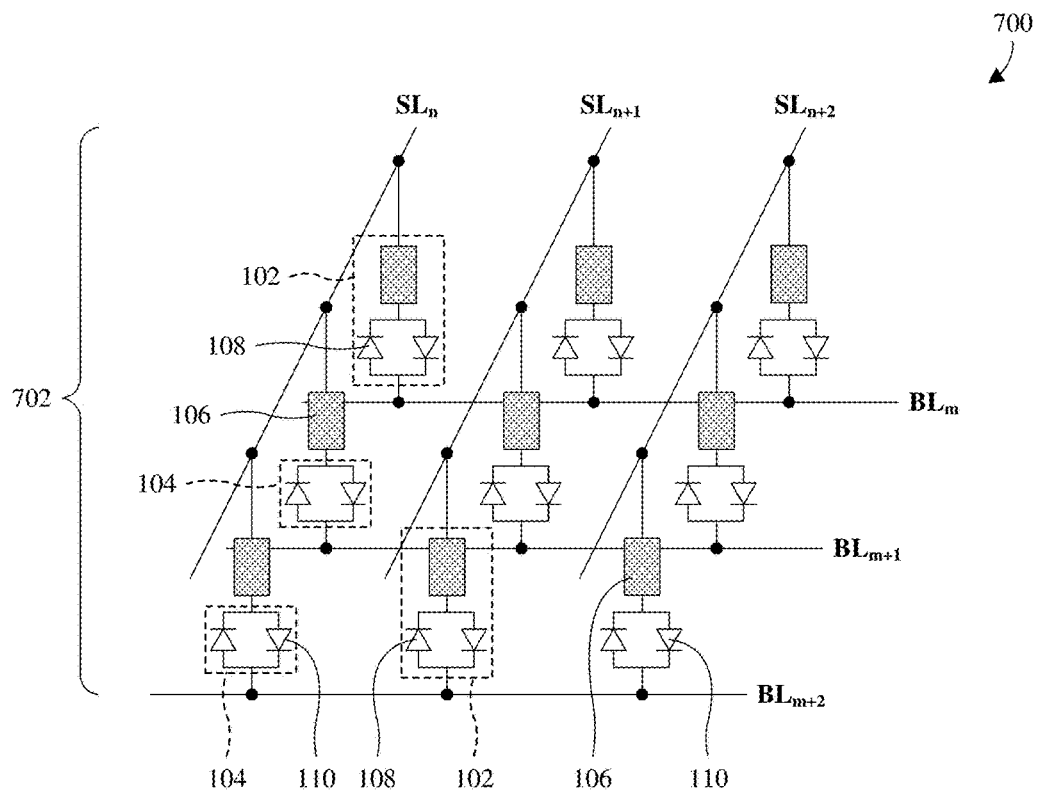
FIG. 7 illustrates a schematic view of some embodiments of a memory array comprising a plurality of memory cells, where the memory cells comprise bipolar selectors having independently tunable threshold voltages.

With reference to FIG. 7, a schematic view 700 of some embodiments of a memory array 702 comprising a plurality of memory cells 102 in a plurality of rows and a plurality of columns is provided. For ease of illustration, only some of the memory cells 102 are labeled 102. In some embodiments, only a portion of the memory array 702 is illustrated. For example, despite the three illustrated rows and the three illustrated columns, more rows and more columns may be present outside the schematic view 700A. In other embodiments, the memory array 702 is fully illustrated and hence has three rows and three columns.

The memory cells 102 comprise individual bipolar selectors 104 having independently tunable threshold voltages, and further comprising individual data-storage elements 106. For ease of illustration, only some of the bipolar selectors 104 are labeled 104, and only some of the data-storage elements 106 are labeled 106. The bipolar selectors 104 are electrically coupled in series with the data-storage elements 106, respectively, and comprise individual first unipolar selectors 108 and individual second unipolar selectors 110. For clarity, only some of the first unipolar selectors 108 are labeled 108, and only some of the second unipolar selectors 110 are labeled 110. The first unipolar selectors 108 are electrically coupled in parallel with the second unipolar selectors 110, respectively, and define threshold voltages of the bipolar selectors 104 at a first polarity. The second unipolar selectors 110 define threshold voltages of the bipolar selectors 104 at a second polarity. The memory cells 102 may, for example, each be as illustrated and described with regard to FIG. 1.

Bit lines extend laterally along corresponding rows of the memory array and electrically couple with memory cells in the corresponding rows, whereas source lines extend laterally along corresponding columns of the memory array and electrically couple with memory cells in the corresponding columns. For clarity, the bit lines are respectively labeled $BL_m$, $BL_{m+1}$, and $BL_{m+2}$, where the subscripts identify corresponding rows and m is an integer variable representing a row in the memory array 702. Similarly, for clarity, the source lines are respectively labeled $SL_n$, $SL_{n+1}$, and $SL_{n+2}$, where the subscripts identify corresponding columns and n is an integer variable representing a column in the memory array.

By appropriately biasing a bit line and a source line, the memory cell at the cross point of the bit line and the source line may be selected and read from or written to. In some embodiments, the bias conditions have different polarities depending upon whether writing a first data state to a memory cell or a second data state to a memory cell. Further, the bipolar selectors 104 prevent read and/or write disturbance to unselected memory cells sharing a bit line or a source line with the selected memory cell.

Figure 8A:
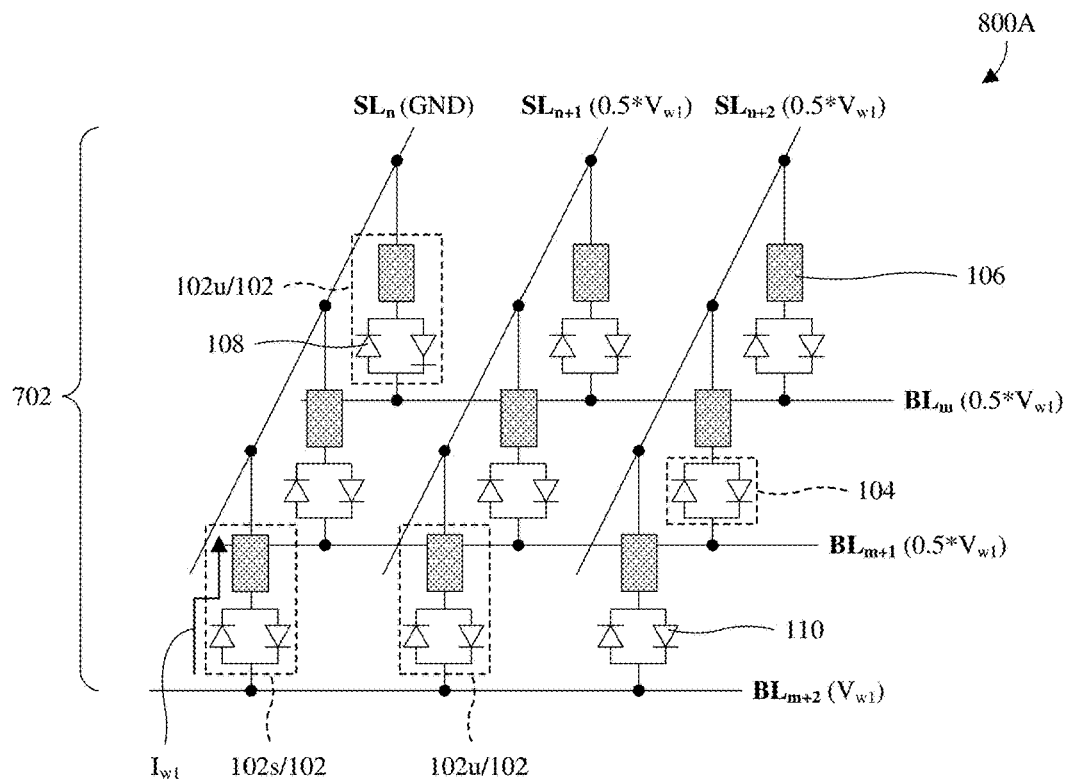
FIGS. 8A-8C illustrate schematic views of some embodiments of the memory array of FIG. 7 at various operational states.
Figure 8B:
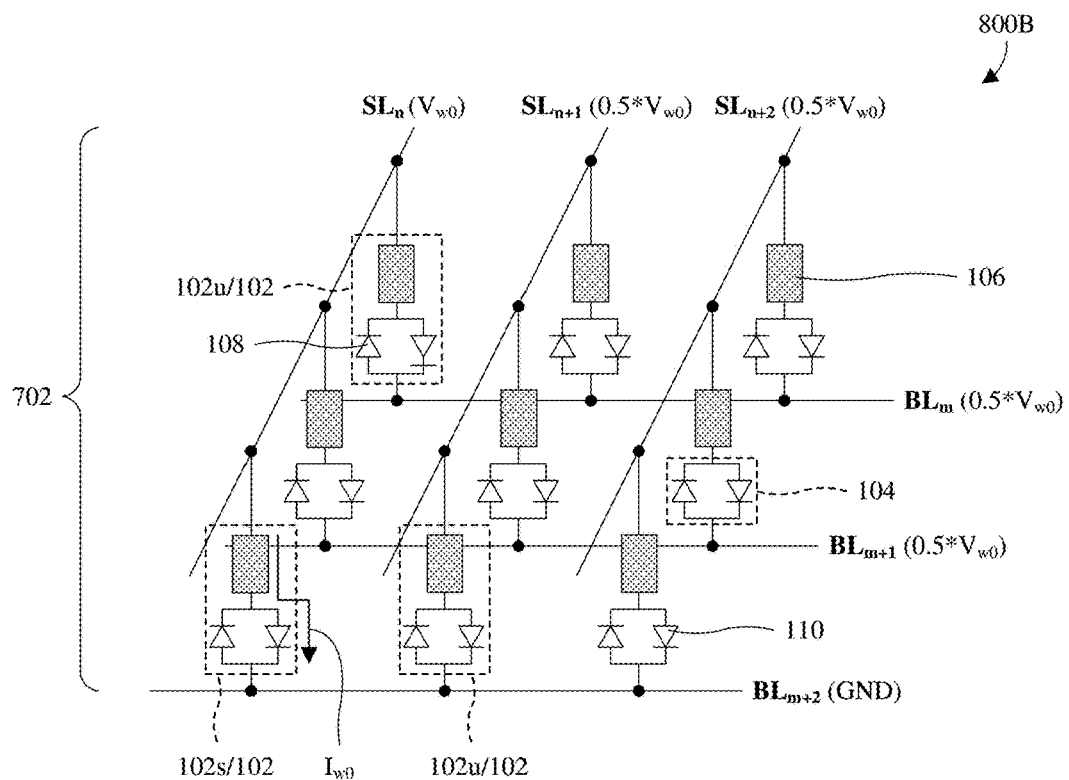
Figure 8C:
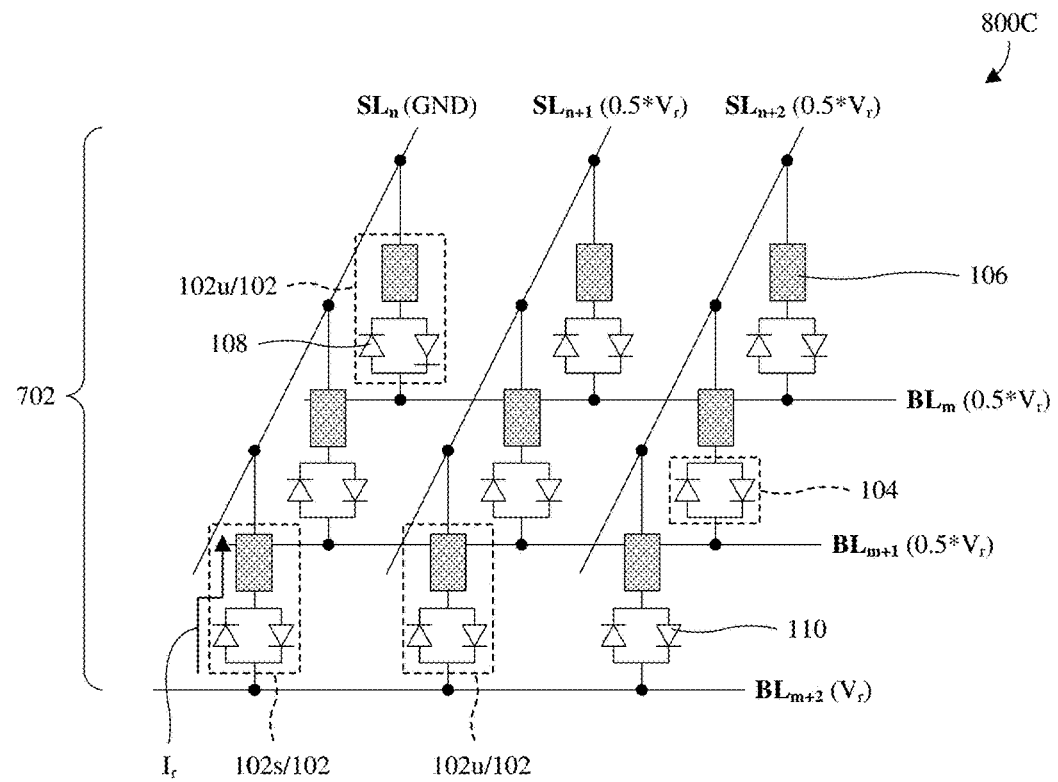

With reference to FIG. 8A-8C, schematic diagram 800A-800C of some embodiments of the memory array 702 of FIG. 7 are provided at various operational states to illustrate operation of the bipolar selectors 104. FIG. 8A illustrates the memory array 702 while writing a selected memory cell 102s to a first data state (e.g., a logic "1"), and FIG. 8B illustrates the memory array 702 while writing the selected memory cell 102s to a second data state (e.g., a logic "0"). FIG. 8C illustrates the memory array 702 while reading a state of the selected memory cell 102s.

As illustrated by FIG. 8A, the selected memory cell 102s is at the cross point of source line $SL_n$ and bit line $BL_{m+2}$. Bit line $BL_{m+2}$ is biased with a first write voltage $V_{w1}$ while source line $SL_n$ is grounded. In some embodiments, the other source lines $SL_{n+1}$, $SL_{n+2}$ and the other bit lines $BL_m$, $BL_{m+1}$ are biased with half the first write voltage $V_{w1}$ or some other fraction of the first write voltage $V_{w1}$ to reduce write disturbance to unselected memory cells. The first write voltage $V_{w1}$ is positive from bit line $BL_{m+2}$ to source $SL_n$, such that the selected memory cell 102s is at a first polarity and the second unipolar selector 110 of the selected memory cell 102s is OFF. Further, the first write voltage $V_{w1}$ exceeds a first threshold voltage of the first unipolar selectors 108, such that the first unipolar selector 108 of the selected memory cell 102s is ON and current $I_{w1}$ flows through the selected memory cell 102s. The current $I_{w1}$, in turn, sets the data-storage element 106 of the selected memory cell 102s to the first data state.

Some unselected memory cells 102u (only some of which are labeled 102u) share source line $SL_n$ and bit line $BL_{m+2}$ with the selected memory cell 102s, whereby these unselected memory cells 102u are also biased at the first polarity. For example, the unselected memory cells 102u may be biased with a voltage that is about half the first write voltage $V_{w1}$. However, the bias voltages of the unselected memory cells 102u are less than the first threshold voltage of the first unipolar selectors 108, whereby the first unipolar selectors 108 of the unselected memory cells 102u are OFF. Further, since the unselected memory cells 102u are biased at the first polarity, the second unipolar selectors 110 of the unselected memory cells 102u are OFF. Accordingly, current does not flow through the unselected memory cells 102u and there is no write disturbance to the unselected memory cells 102u.

As illustrated by FIG. 8B, source line $SL_n$ is biased with a second write voltage $V_{w0}$ while bit line is $BL_{m+2}$ is grounded. In some embodiments, the other source lines $SL_{n+1}$, $SL_{n+2}$ and the other bit lines $BL_m$, $BL_{m+1}$ are biased with half the second write voltage $V_{w0}$ or some other fraction of the second write voltage $V_{w0}$. The second write voltage $V_{w0}$ is positive from source line $SL_n$ to bit line $BL_{m+2}$, such that the selected memory cell 102s is at a second polarity and the first unipolar selector 108 of the selected memory cell 102s is OFF. Further, the second write voltage $V_{w0}$ exceeds a second threshold voltage of the second unipolar selectors 110, such that the second unipolar selector 110 of the selected memory cell 102s is ON and current $V_{w0}$ flows through the selected memory cell 102s. The current $V_{w0}$, in turn, sets the data-storage element 106 of the selected memory cell 102s to the second data state.

The unselected memory cells 102u sharing source line $SL_n$ and bit line $BL_{m+2}$ with the selected memory cell 102s are also biased at the second polarity. For example, the unselected memory cells 102u may be biased with a voltage that is about half the second write voltage $V_{w0}$. However, the bias voltages of the unselected memory cells 102u are less than the second threshold voltage of the second unipolar selectors 110, whereby the second unipolar selectors 110 of the unselected memory cells 102u are OFF. Further, since the unselected memory cells 102u are biased at the second polarity, the first unipolar selectors 108 of the unselected memory cells 102u are OFF. Accordingly, current does not flow through the unselected memory cells 102u and there is no write disturbance to the unselected memory cells 102u.

As illustrated by FIG. 8C, bit line $BL_{m+2}$ is biased with a read voltage $V_r$ while source line $SL_n$ is grounded. FIG. 8C is as FIG. 8A is described except that the read voltage $V_r$ is used in place of the first write voltage $V_{w1}$ and is small enough that the resulting read current $I_r$ does not change a state of the selected memory cell 102s. When resistances of the data-storage elements 106 vary with corresponding data states, the selected memory cell 102s is in the first data state or the second data state depending upon the extent of the read current $I_r$.

In some embodiments, the first and second write voltages $V_{w1}$, $V_{w0}$ and the read voltage $V_r$ are different, whereby the first and second threshold voltages of the bipolar selectors 104 are different to properly match the bias conditions during the different operations. A properly matching threshold voltage for the second polarity may, for example, be a voltage halfway between: 1) a voltage across the bipolar selector 104 of the selected memory cell 102s during the second write operation (see FIG. 8B); and 2) a voltage across the bipolar selectors 104 of the unselected memory cells 102u during the second write operation (see FIG. 8B). Since the first write operation and the read operation are both performed at the first polarity, the bias conditions during both operations may be considered when properly selecting the first threshold voltage. A properly matching threshold voltage for the first polarity may, for example, be a voltage halfway between: 1) a voltage across the bipolar selector 104 of the selected memory cell 102s during the read operation (see FIG. 8C); and 2) a voltage across the bipolar selectors 104 of the unselected memory cells 102u during the first write operation (see FIG. 8A). The first threshold voltage may, for example, be independently tuned relative to the second threshold voltage and vice versa because the first threshold voltage is set by the first unipolar selectors 108 and the second threshold voltage is are separately defined by the second unipolar selectors 110.

Figure 9A:
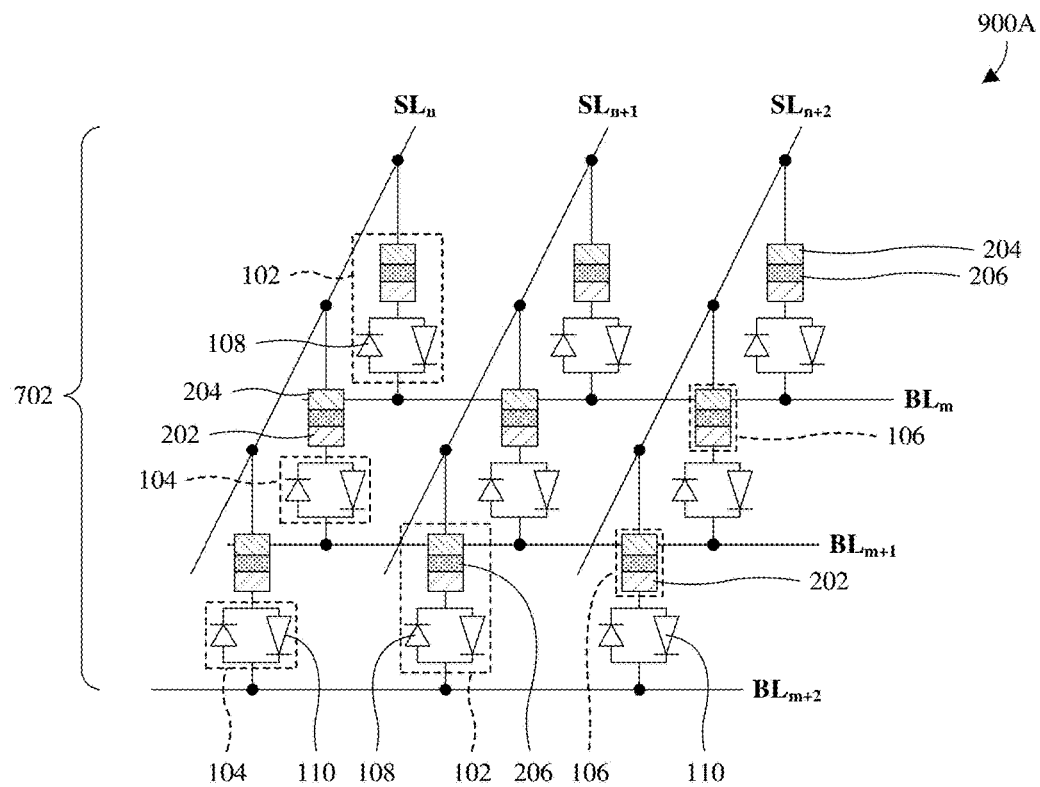
FIGS. 9A-9D illustrate schematic views of various alternative embodiments of the memory array of FIG. 7.

With reference to FIG. 9A, a schematic view 900A of some alternative embodiments of the memory array 702 of FIG. 7 is provided in which the memory cells 102 are each as illustrated and described with regard to FIG. 2A. The data-storage elements 106 comprise individual reference elements 202, individual free elements 204, and individual barrier elements 206. For ease of illustration, only some of the reference elements 202 are labeled 202, only some of the free elements 204 are labeled 204, and only some of the barrier elements 206 are labeled 206. The free elements 204 overlie the reference elements 202, and the barrier elements are sandwiched between the reference elements 202 and the free elements 204.

Figure 9B:
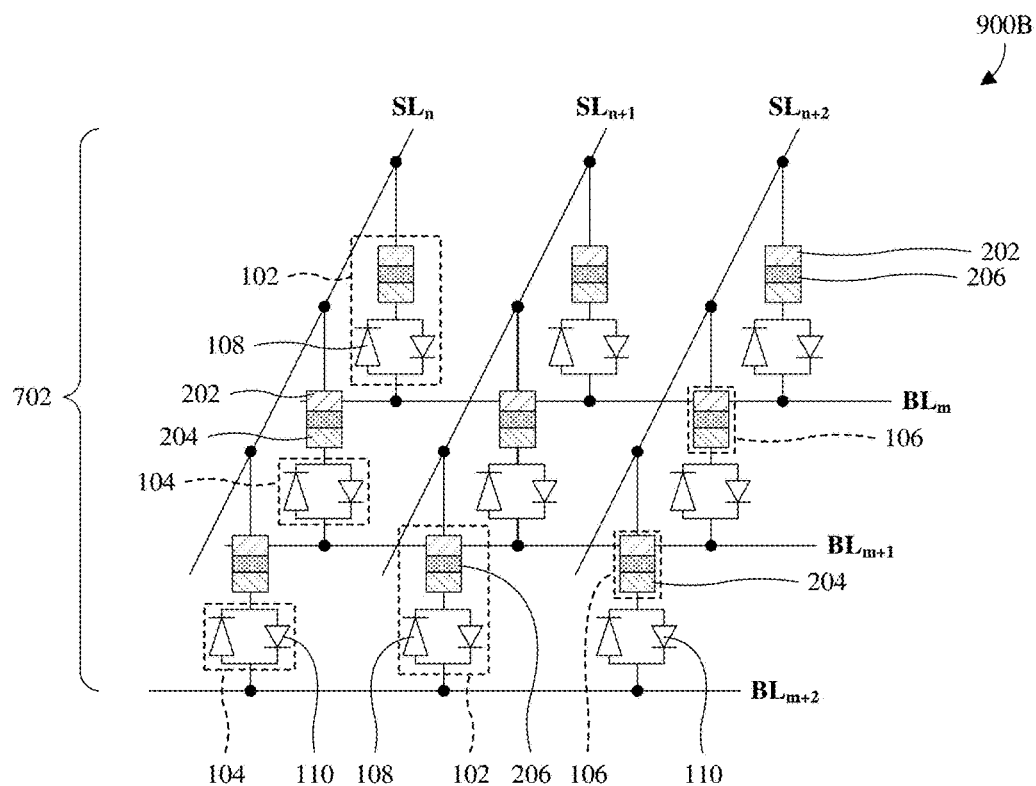
Figure 9C:
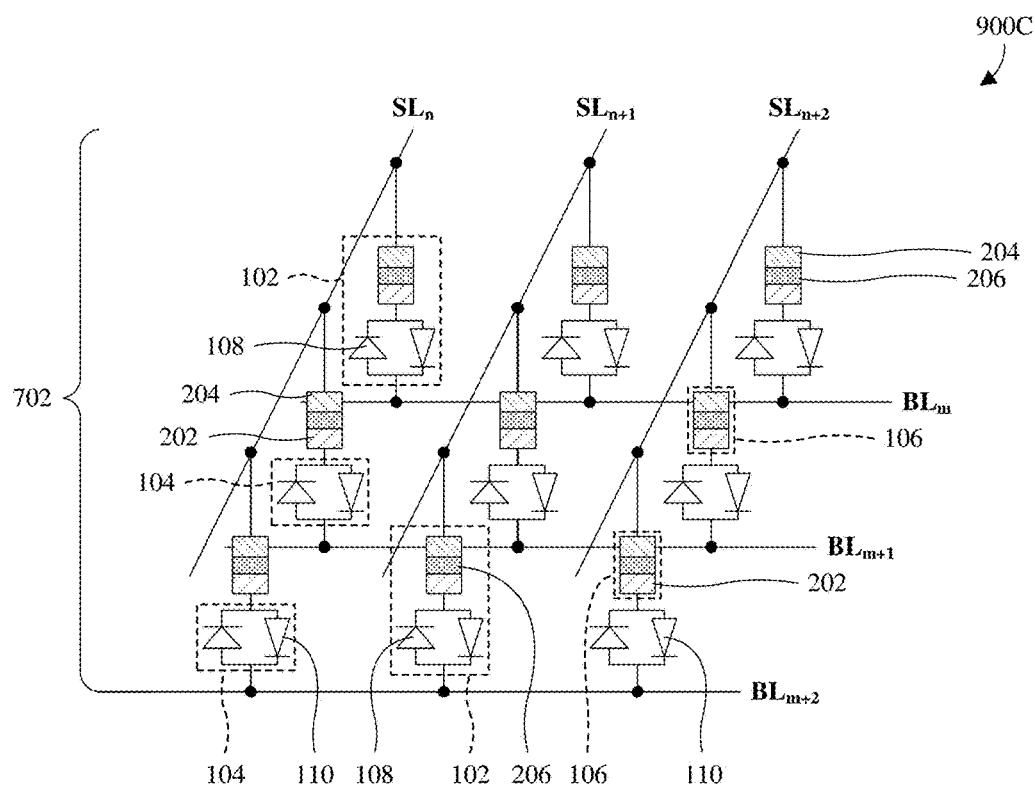
Figure 9D:
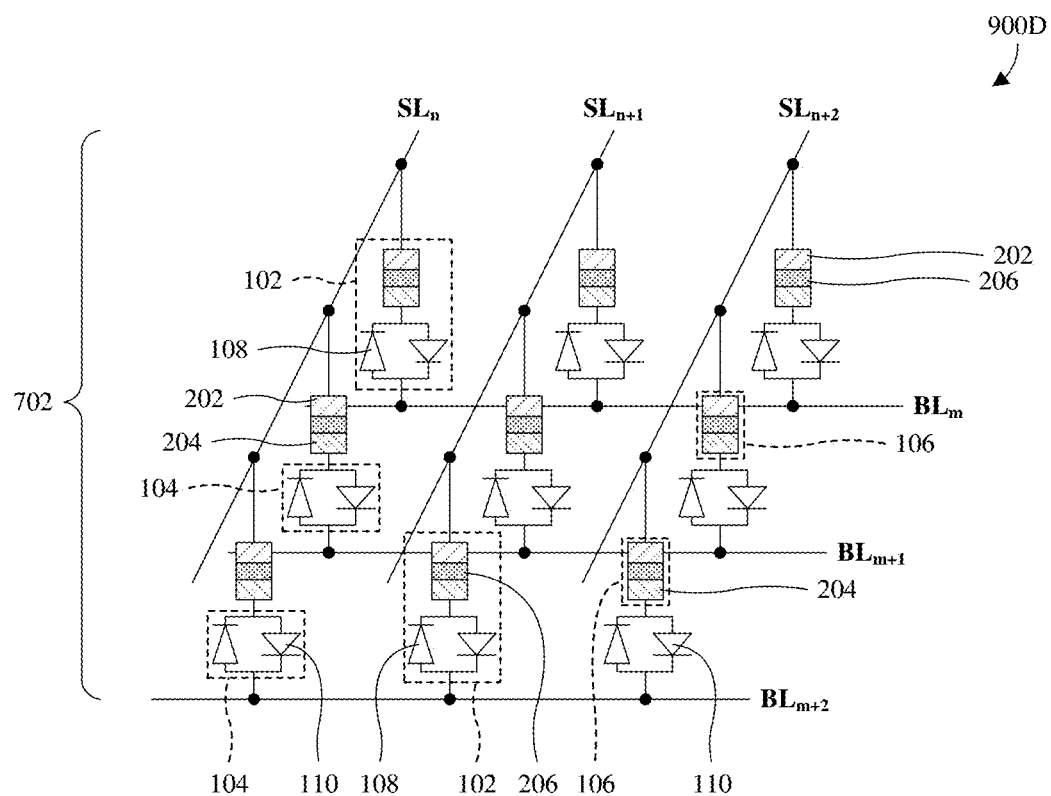

With reference to FIG. 9B, a schematic view 900B of some alternative embodiments of the memory array 702 of FIG. 9A is provided in which the memory cells 102 are each as illustrated and described with regard to FIG. 2B instead of FIG. 2A. With reference to FIG. 9C, a schematic view 900C of some alternative embodiments of the memory array 702 of FIG. 9A is provided in which the memory cells 102 are each as illustrated and described with regard to FIG. 3A instead of FIG. 2A. With reference to FIG. 9D, a schematic view 900D of some alternative embodiments of the memory array 702 of FIG. 9A is provided in which the memory cells 102 are each as illustrated and described with regard to FIG. 3B instead of FIG. 2A.

Figure 10A:
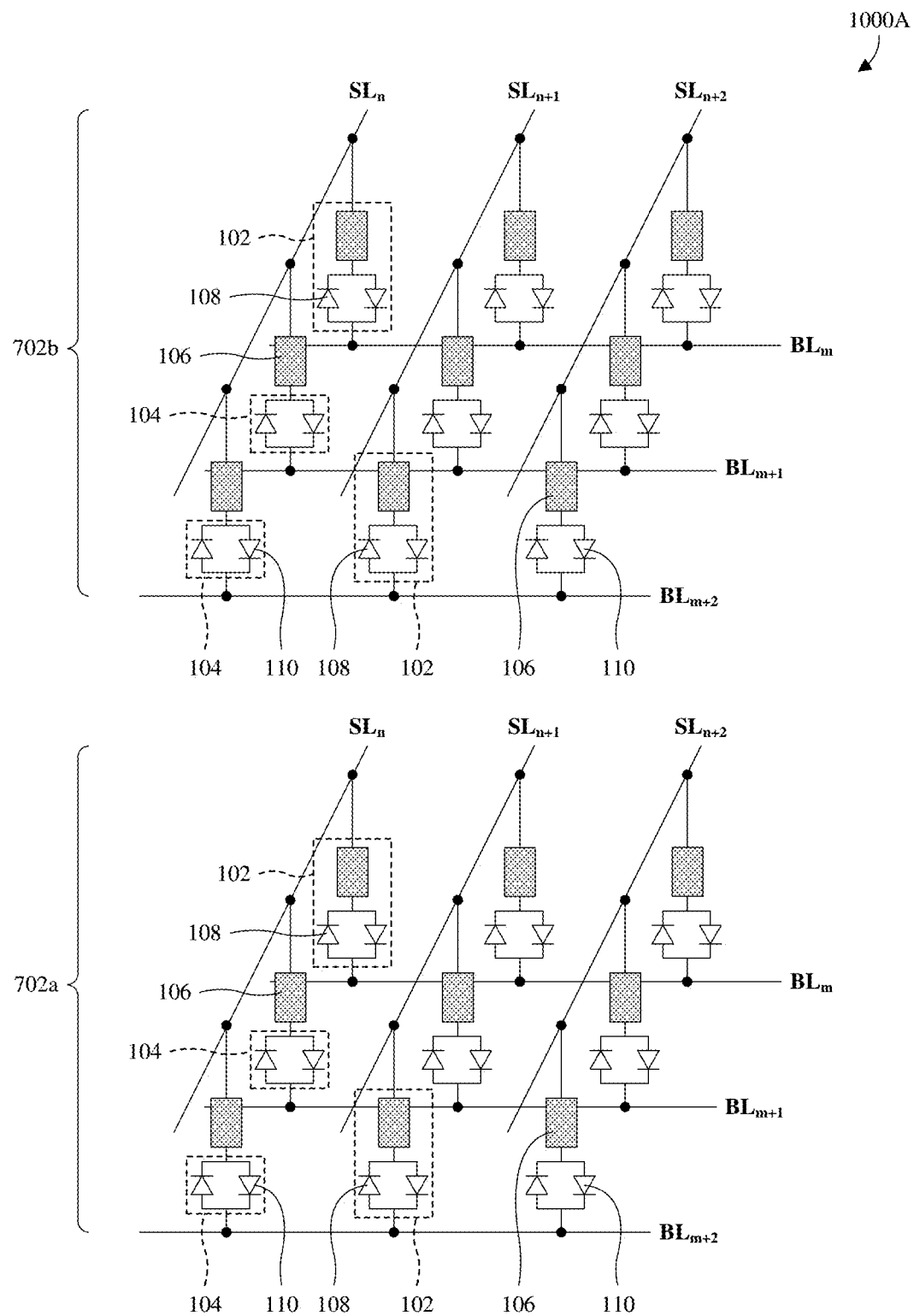
FIGS. 10A and 10B illustrate schematic views of various embodiments of a three-dimension (3D) memory array comprising a plurality of memory cells, where the memory cells comprise bipolar selectors having independently tunable threshold voltages.

With reference to FIG. 10A, a schematic view 1000A of some embodiments of a three-dimensional (3D) memory array comprising a first memory array 702a and a second memory array 702b is provided. The first and second memory arrays 702a, 702b are stacked, such that the second memory array 702b overlies and is spaced from the first memory array 702a. Stacking the first and second memory arrays 702a, 702b may, for example, enhance memory density. In some embodiments, as illustrated, the first and second memory arrays 702a, 702b are each as the memory array 702 in FIG. 7 is illustrated and described. In other embodiments, the first and second memory arrays 702a, 702b are each as the memory array 702 in any one of FIGS. 9A-9D is illustrated and described. In yet other embodiments, the first memory array 702a is as the memory array 702 in one of FIGS. 7 and 9A-9D is illustrated and described, and the second memory array 702b is as the memory array 702 in another one of FIGS. 7 and 9A-9D is illustrated and described.

Figure 10B:
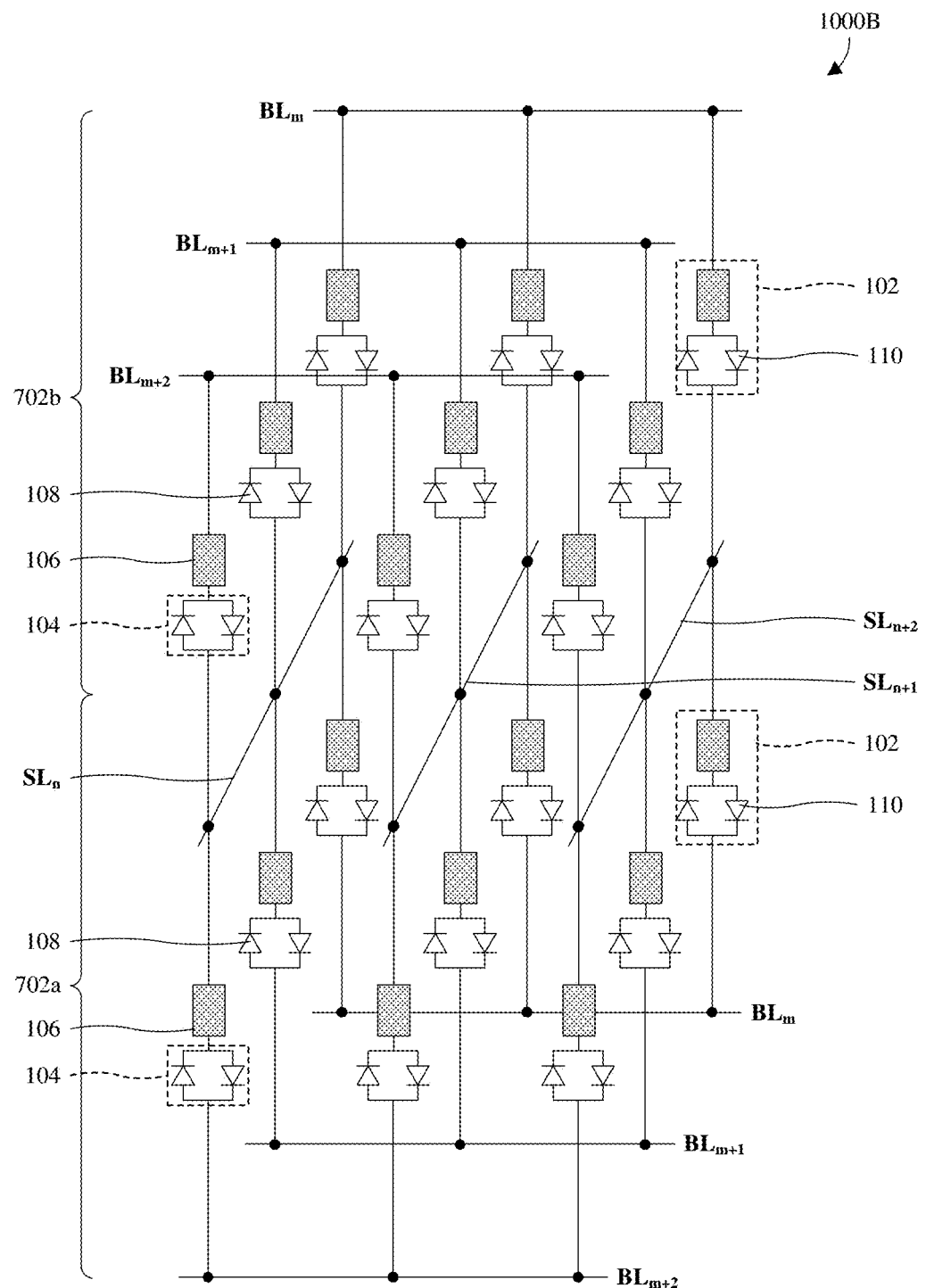

With reference to FIG. 10B, a schematic view 1000B of some alternative embodiments the 3D memory array of FIG. 10A is provided in which the first and second memory arrays 702a, 702b share source lines. As above, the source lines are respectively labeled $SL_n$, $SL_{n+1}$, and $SL_{n+2}$, where the subscripts identify corresponding columns and n is an integer variable representing a column in the 3D memory array.

Figures 11A, 11B:
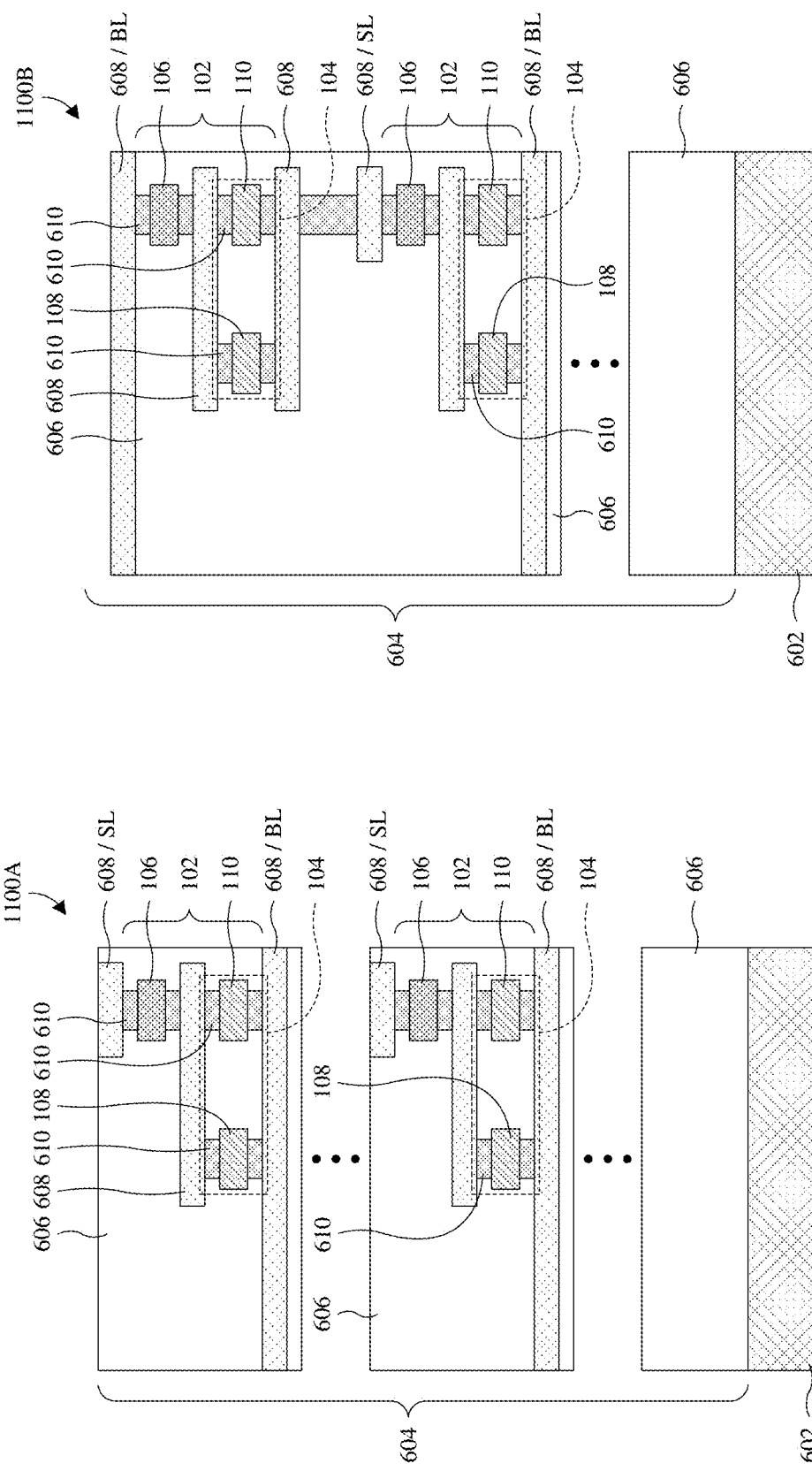
FIGS. 11A and 11B illustrate cross-sectional views of various embodiments of an integrated chip comprising a pair of stacked memory cells respectively in FIGS. 10A and 10B.

With reference to FIG. 11A, a cross-sectional view 1100A of some embodiments of an integrated chip comprising a pair of stacked memory cells 102 from the 3D memory array of FIG. 10A is provided. The stacked memory cells 102 are at the same row and the same column in the 3D memory array. Further, a lower one of the stacked memory cells 102 is in the first memory array 702a of FIG. 10A, whereas an upper one of the stacked memory cells 102 is in the second memory array 702b of FIG. 10A. The stacked memory cells 102 overlie a substrate 602 and are surrounded by an interconnect dielectric layer 606 of an interconnect structure 604. Further, wires 608 and vias 610 in the interconnect dielectric layer 606 electrically interconnect components of the stacked memory cells 102.

With reference to FIG. 11B, a cross-sectional view 1100B of some alternative embodiments of the integrated chip of FIG. 11A is provided in which the stacked memory cells 102 are instead from the 3D memory array of FIG. 10B. Accordingly, the stacked memory cells 102 share a source line SL defined by one of the wires 608.

With reference to FIGS. 12-17, a series of cross-sectional views 1200-1700 of some embodiments of a method for forming an integrated chip comprising a memory array is provided in which memory cells of the memory array comprise bipolar selectors with independently tunable threshold voltages. For ease of illustration, the cross-sectional views 1200-1700 only illustrate a first memory cell of the memory array. However, other memory cells of the memory array may, for example, be formed simultaneously with the first memory cell and/or each of the other memory cells may, for example, be formed as illustrated for the first memory cell.

Figure 12:
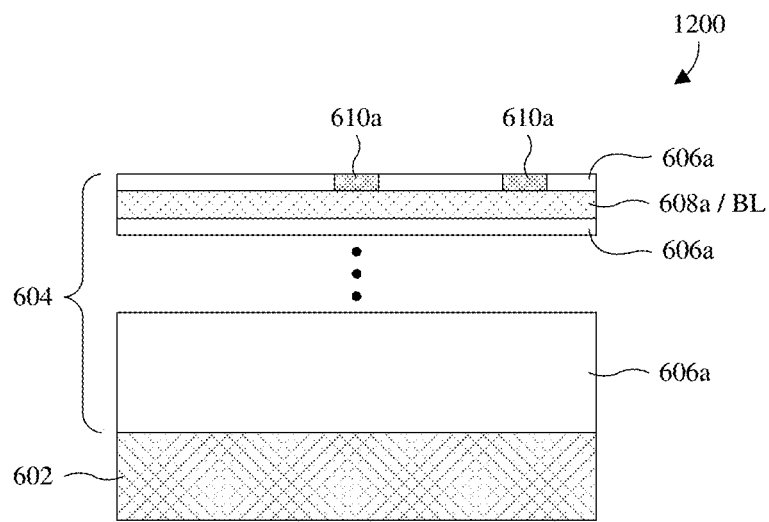
FIGS. 12-17 illustrate a series of cross-sectional views of some embodiments of a method for forming an integrated chip comprising a memory array, where memory cells of the memory array comprise bipolar selectors with independently tunable threshold voltages.

As illustrated by the cross-sectional view 1200 of FIG. 12, an interconnect structure 604 is partially formed over a substrate 602. The substrate 602 may, for example, be a bulk silicon substrate, a silicon-on-insulator (SOI) substrate, or some other suitable substrate. The interconnect structure 604 comprises a first interconnect dielectric layer 606a, a first wire 608a defining a bit line BL, and a first set of vias 610a. The first interconnect dielectric layer 606a accommodates the first wire 608a and the first vias 610a and may, for example, be or comprise silicon oxide, a low κ dielectric, some other suitable dielectric(s), or any combination of the foregoing. A low κ dielectric may be, for example, a dielectric with a dielectric constant κ less than about 3.9, 3, 2, or 1. The first wire 608a and the first vias 610a are stacked in the first interconnect dielectric layer 606a, such that the first vias 610a overlie the first wire 608a.

In some embodiments, semiconductor devices (not shown) are on the substrate 602, between the substrate 602 and the interconnect structure 604. In some embodiments, additional wires (not shown) and/or additional vias (not shown) are alternatingly stacked in the first interconnect dielectric layer 606a, between the substrate 602 and/or the first wire 608a. The additional wires and/or the additional vias may, for example, define conductive paths leading from semiconductor devices (not shown) on the substrate 602. In some embodiments, a process for partially forming the interconnect structure 604 comprises: 1) depositing a lower interconnect portion of the first interconnect dielectric layer 606a on the substrate 602; 2) forming the first wire 608a inset into the lower interconnect portion; 3) forming an upper interconnect portion of the first interconnect dielectric layer 606a on the first wire 608a and the lower interconnect portion; and 4) forming the first vias 610a inset into the upper interconnect portion. Other processes for partially forming the interconnect structure 604 are, however, amenable.

Figure 13:
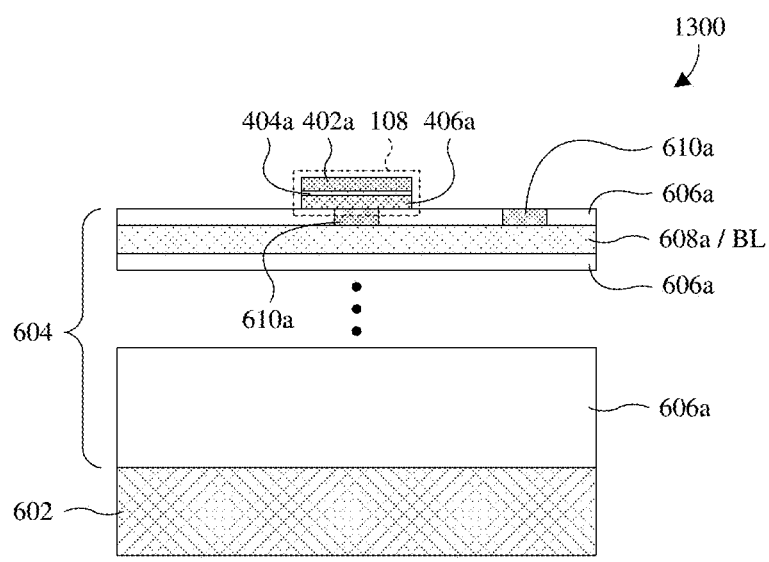

As illustrated by the cross-sectional view 1300 of FIG. 13, a first unipolar selector 108 is formed overlying the bit line BL and electrically coupled to the bit line BL by one of the first vias 610a. The first unipolar selector 108 comprises a cathode 402a, an insulator 404a, and an anode 406a. The insulator 404a is between the cathode 402a and the anode 406a, and the cathode 402a overlies the anode 406a. The cathode 402a, the insulator 404a, and the anode 406a may, for example, define a PIN diode, a MIM device, or some other multilayer device.

In some embodiments in which the cathode 402a, the insulator 404a, and the anode 406a define a PIN diode, the cathode 402a is or comprise N-type semiconductor material, the anode 406a is or comprises P-type semiconductor material, and the insulator 404a is or comprise intrinsic or lightly doped semiconductor material. The insulator 404a may, for example, be lightly doped relative to the cathode 402a and/or the anode 406a. The semiconductor material for the cathode 402a, the insulator 404a, and the anode 406a may, for example, be or comprises polysilicon, monocrystalline silicon, or some other suitable semiconductor material. In some embodiments in which the cathode 402a, the insulator 404a, and the anode 406a define a MIM device, the cathode 402a and the anode 406a are or comprise metal or some other suitable conductive material and/or the insulator 404a is or comprises doped hafnium oxide, some other suitable metal oxide, or some other suitable insulator material.

In some embodiments, a process for forming the first unipolar selector 108 comprises: 1) depositing an anode layer on the interconnect structure 604; 2) depositing an insulator layer on the anode layer; 3) depositing a cathode layer on the insulator layer; and 4) patterning the multilayer film into the first unipolar selector 108. Other processes are, however, amenable. The depositing may, for example, be performed by chemical vapor deposition (CVD), physical vapor deposition (PVD), electroless plating, electroplating, some other suitable deposition process(es), or any combination of the foregoing. The patterning may, for example, be performed by a photolithography/etching process and/or some other suitable patterning process(es).

Figure 14:
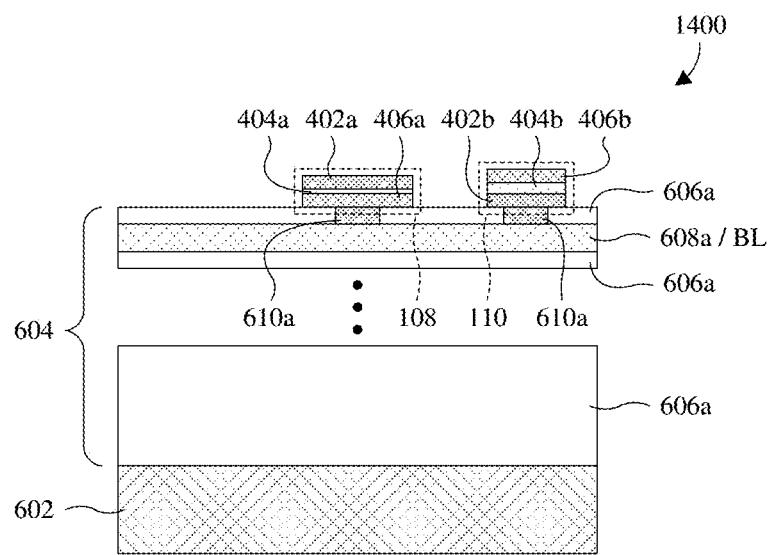

As illustrated by the cross-sectional view 1400 of FIG. 14, a second unipolar selector 110 is formed overlying the bit line BL, adjacent to the first unipolar selector 108 and electrically coupled to the bit line BL by another one of the first vias 610a. Similar to the first unipolar selector 110, the second unipolar selector 110 comprises a cathode 402b, an insulator 404b, and an anode 406b, and the insulator 404b is between the cathode 402b and the anode 406b. However, in contrast with the first unipolar selector 108, the anode 406b overlies the cathode 402b and the second unipolar selector 110 has a different orientation than the first unipolar selector 108. The cathode 402b, the insulator 404b, and the anode 406b may, for example, define a PIN diode, a MIM device, or some other multilayer device.

In some embodiments in which the cathode 402b, the insulator 404b, and the anode 406b define a PIN diode, the cathode 402b, the insulator 404b, and the anode 406b are as corresponding counterparts are described for the first unipolar selector 108. In some embodiments in which the cathode 402b, the insulator 404b, and the anode 406b define a MIM device, the cathode 402b, the insulator 404b, and the anode 406b are as corresponding counterparts are described for the first unipolar selector 108.

In some embodiments, the insulator 404b of the second unipolar selector 110 has a greater thickness than the insulator 404a of the first unipolar selector 108 so the second unipolar selector 110 has a greater threshold voltage than the first unipolar selector 108. The differences between threshold voltages of the first and second unipolar selectors 108, 110 may, for example, enable the first and second unipolar selectors 108, 110 to better match corresponding bias conditions to reduce read and/or write disturbance. In some embodiments, the first and second unipolar selectors 110 have different widths.

In some embodiments, a process for forming the second unipolar selector 110 comprises: 1) depositing a cathode layer on the interconnect structure 604; 2) depositing an insulator layer on the anode layer; 3) depositing an anode layer on the insulator layer; and 4) patterning the multilayer film into the first unipolar selector 108. Other processes are, however, amenable. The depositing and the patterning may, for example, be as described for the first unipolar selector 108.

Figure 15:
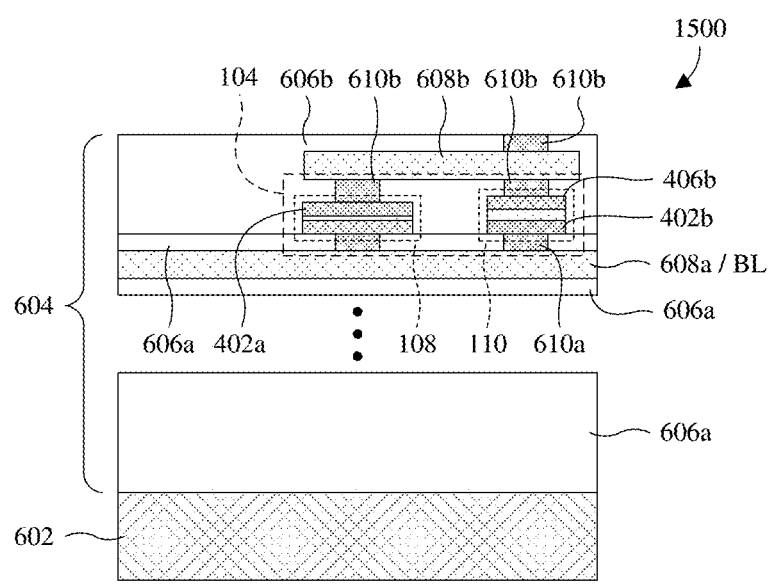

As illustrated by the cross-sectional view 1500 of FIG. 15, the interconnect structure 604 is extended around the first and second unipolar selectors 108, 110, such that the interconnect structure 604 electrically couples the first and second unipolar selectors 108, 110 in parallel to define a bipolar selector 104. The extended interconnect structure 604 further comprises a second interconnect dielectric layer 606b, a second wire 608b, and a set of second vias 610b. The second interconnect dielectric layer 606b accommodates the second wire 608b and the second vias 610b, and may, for example, be as the first interconnect dielectric layer 606a is described. The second wire 608b and the second vias 610b are stacked in the second interconnect dielectric layer 606b, such that the second wire 608b is electrically coupled to the first and second unipolar selectors 108, 110 by some of the second vias 610b and one of the second vias 610b overlies the second wire 608b.

In some embodiments, a process for extending the interconnect structure 604 comprises: 1) depositing a lower interconnect portion of the second interconnect dielectric layer 606b; 2) simultaneously forming the second wire 608b and second vias 610b underlying the second wire 608b inset into the lower interconnect portion; 3) forming an upper interconnect portion of the second interconnect dielectric layer 606b on the second wire 608b and the lower interconnect portion; and 4) forming a second vias 610b overlying the second wire 608b and inset into the upper interconnect portion. Other processes for extending the interconnect structure 604 are, however, amenable.

Figure 16:
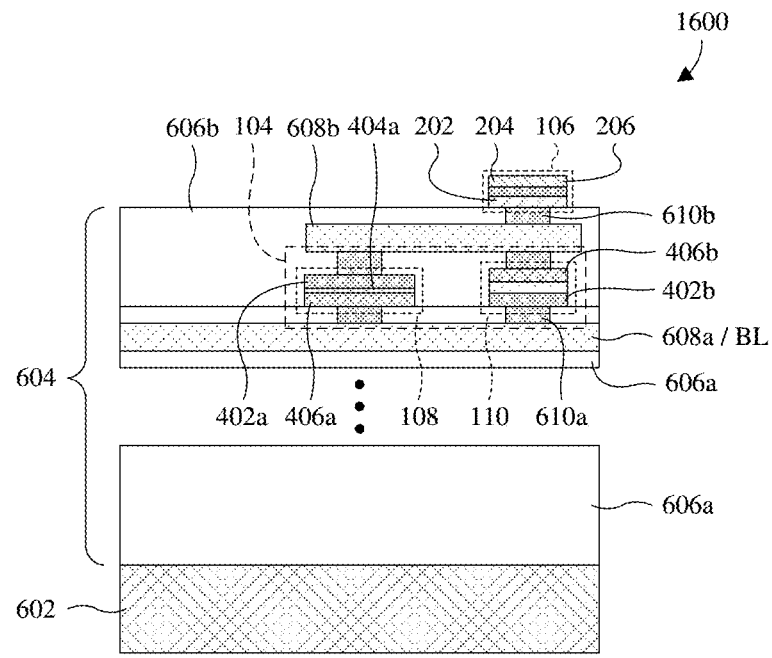

As illustrated by the cross-sectional view 1600 of FIG. 16, a data-storage element 106 is formed overlying the interconnect structure 604, on one of the second vias 610b. The data-storage element 106 may, for example, be an MTJ, a MIM stack, or some other suitable structure for data storage. In some embodiments in which the data-storage element 106 is an MTJ, the data-storage element 106 comprises a reference element 202, a free element 204, and a barrier element 206. The barrier element 206 is non-magnetic and is sandwiched between the reference and free elements 202, 204. The reference and free elements 202, 204 are ferromagnetic, and the free element 204 overlies the reference element 202 and the barrier element 206. Alternatively, locations of the reference and free elements 202, 204 are switched.

In some embodiments, a process for forming the data-storage element 106 comprises: 1) depositing a reference layer on the interconnect structure 604; 2) depositing a barrier layer on the reference layer; 3) depositing a free layer on the barrier layer; and 4) patterning the reference, barrier, and free layers into the data-storage element 106. Other processes are, however, amenable. For example, the free layer may be deposited at 1) and the reference layer may be deposited at 3). The depositing may, for example, be performed by CVD, PVD, electroless plating, electroplating, some other suitable deposition process(es), or any combination of the foregoing. The patterning may, for example, be performed by a photolithography/etching process and/or some other suitable patterning process(es).

Figure 17:
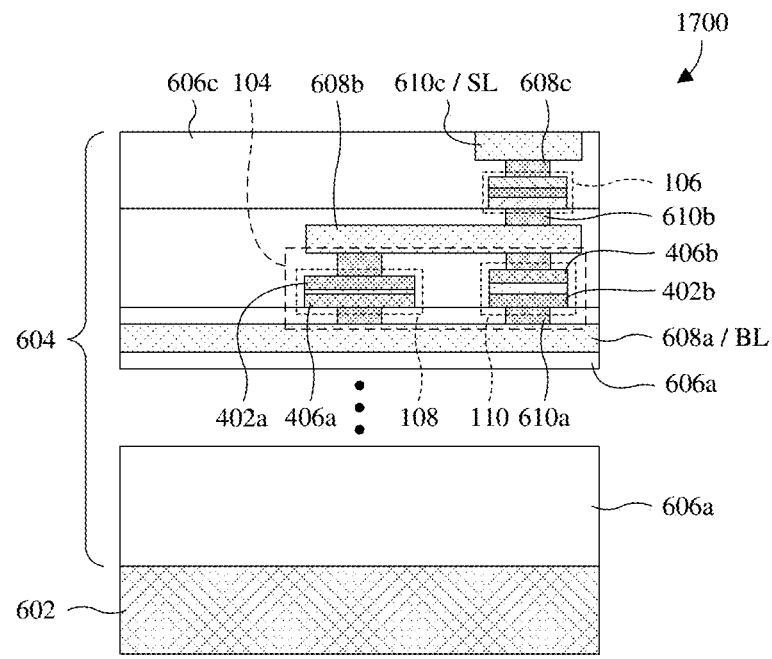

As illustrated by the cross-sectional view 1700 of FIG. 17, the interconnect structure 604 is completed around the data-storage element 106. The completed interconnect structure 604 comprises a third interconnect dielectric layer 606c, a third wire 608c defining a source line SL, and a third via 610c. The third interconnect dielectric layer 606c accommodates the third wire 608c and the third via 610c. Further, the third interconnect dielectric layer 606c may, for example, be as the first interconnect dielectric layer 606a is described. In some embodiments, a process for completing the interconnect structure 604 comprises: 1) depositing the third interconnect dielectric layer 606c; and 2) simultaneously forming the third wire 608c and the third via 610c inset into the third interconnect dielectric layer 606c. Other processes for extending the interconnect structure 604 are, however, amenable.

The method illustrated by FIGS. 12-17 may, for example, be employed to form the memory cell in any one of FIG. 1, 2A, 2B, 3A, 3B, 4A, or 4B, the integrated chip in any one of FIG. 6A, 6B, 11A, or 11B, or the memory array in any one of FIG. 7, 8A-8C, 9A-9D, 10A, or 10B. Further, while the cross-sectional views 1200-1700 shown in FIGS. 12-17 are described with reference to a method, it will be appreciated that the structures shown in FIGS. 12-17 are not limited to the method and may stand alone without the method.

Figure 18:
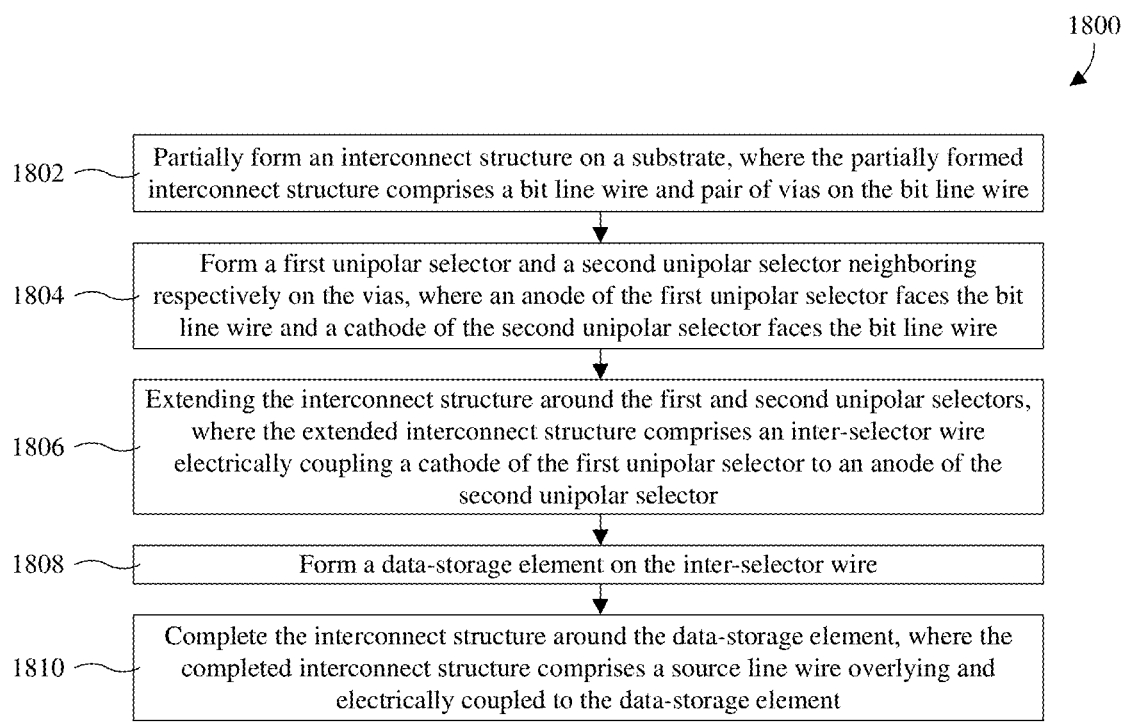
FIG. 18 illustrates a block diagram of some embodiments of the method of FIGS. 12-17.

With reference to FIG. 18, a block diagram 1800 of some embodiments of the method of FIGS. 12-17 is provided.

At 1802, an interconnect structure is partially formed on a substrate, where the partially formed interconnect structure comprises a bit line wire and pair of vias on the bit line wire. See, for example, FIG. 12.

At 1804, a first unipolar selector and a second unipolar selector are formed neighboring respectively on the vias, where an anode of the first unipolar selector faces the bit line wire and a cathode of the second unipolar selector faces the bit line wire. See, for example, FIGS. 13 and 14.

At 1806, the interconnect structure is extended around the first and second unipolar selectors, where the extended interconnect structure comprises an inter-selector wire electrically coupling a cathode of the first unipolar selector to an anode of the second unipolar selector. See, for example, FIG. 15.

At 1808, a data-storage element is formed on the inter-selector wire. See, for example, FIG. 16.

At 1810, the interconnect structure is formed around the data-storage element, where the completed interconnect structure comprises a source line wire overlying and electrically coupled to the data-storage element. See, for example, FIG. 17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a memory cell including: a data-storage element having a variable resistance; and a bipolar selector electrically coupled in series with the data-storage element, wherein the bipolar selector includes a first unipolar selector and a second unipolar selector, and wherein the first and second unipolar selectors are electrically coupled in parallel with opposite orientations. In some embodiments, a cathode of the first unipolar selector is electrically coupled to an anode of the second unipolar selector. In some embodiments, the first and second unipolar selector are diodes. In some embodiments, the bipolar selector has a first threshold voltage at a first polarity and a second threshold voltage at a second polarity, and wherein the first and second unipolar selectors individually define the first and second threshold voltages. In some embodiments, the first and second threshold voltages are different. In some embodiments, the data-storage element includes a MTJ, and wherein the MTJ includes a reference ferromagnetic element and a free ferromagnetic element. In some embodiments, the free ferromagnetic element is electrically separated from the bipolar selector by the reference ferromagnetic element, wherein the reference ferromagnetic element is electrically separated from an anode of the first unipolar selector by a cathode of the first unipolar selector, and wherein a threshold voltage of the first unipolar selector is less than a threshold of the second unipolar selector. In some embodiments, the reference ferromagnetic element is electrically separated from the bipolar selector by the free ferromagnetic element, wherein the free ferromagnetic element is electrically separated from an anode of the first unipolar selector by a cathode of the first unipolar selector, and wherein a threshold voltage of the first unipolar selector is greater than a threshold of the second unipolar selector. In some embodiments, a width of the first unipolar selector is different than a width of the second unipolar selector.

In some embodiments, the present application provides an integrated chip including: an array including multiple memory cells in a plurality of rows and a plurality of columns, wherein the memory cells include individual bipolar selectors and individual data-storage elements, and wherein the bipolar selectors each include a first selector and a second selector electrically coupled in parallel with opposite orientations; multiple first conductive lines extending along corresponding rows of the array and electrically couple with memory cells of the array in the corresponding rows; and multiple second conductive lines extending along corresponding columns of the array and electrically couple with memory cells of the array in the corresponding columns. In some embodiments, the memory cells are MRAM cells. In some embodiments, the first and second selectors are unipolar selectors, wherein an anode of the first selector is directly electrically coupled to a cathode of the second selector, and wherein a cathode of the first selector is directly electrically coupled to an anode of the second selector. In some embodiments, the integrated chip further includes: a second array including multiple second memory cells in a plurality of rows and a plurality of columns, wherein the second memory cells include individual second bipolar selectors and individual second data-storage elements, and wherein the second conductive lines extend along corresponding columns of the second array and electrically couple with second memory cells of the second array in the corresponding columns; and multiple third conductive lines extending along corresponding rows of the second array and electrically coupling with second memory cells of the second array in the corresponding rows, wherein the second conductive lines are vertically between the first conductive lines and the second conductive lines. In some embodiments, the first and second selectors are diodes having different threshold voltages in forward-biased states.

In some embodiments, the present application provides a method including: providing a memory array including multiple memory cells in multiple rows and multiple columns, wherein the memory cells include a first memory cell, wherein the first memory cell includes a first unipolar selector and a second unipolar selector, and wherein the first and second unipolar selectors are electrically coupled in parallel with opposite orientations; applying a first voltage across the first memory cell at a first polarity, wherein the first and second unipolar selectors are respectively ON and OFF while applying the first voltage across the first memory cell; and applying a second voltage across the first memory cell at a second polarity different than the first polarity, wherein the first and second unipolar selectors are respectively OFF and ON while applying the second voltage across the first memory cell. In some embodiments, the applying of the first voltage sets the first memory cell to a first resistive state, and wherein the applying of the second voltage sets the first memory cell to a second resistive state that is different than the first resistive state. In some embodiments, the memory cells further includes a second memory cell in the same row or column as the first memory cell, wherein the second memory cell includes a third selector and a fourth selector, wherein the third and fourth selectors are electrically coupled in parallel with opposite orientations, and wherein the method further includes: applying a third voltage across the second memory cell at the first polarity while applying the first voltage across the memory cell at the first polarity, wherein the third and fourth selectors are OFF while applying the third voltage. In some embodiments, the method further includes: applying a fourth voltage across the second memory cell at the second polarity while applying the second voltage across the memory cell at the second polarity, wherein the third and fourth selectors are OFF while applying the fourth voltage. In some embodiments, the first unipolar selector has a threshold voltage between the first and third voltages. In some embodiments, the first and second unipolar selectors are diodes, and wherein the first and second unipolar selectors are each forward biased while ON, and wherein the first and second unipolar selectors are each reverse biased while OFF.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
a data-storage element having a variable resistance and comprising a magnetic tunnel junction (MTJ), wherein the MTJ comprises a reference ferromagnetic element and a free ferromagnetic element; and
a bipolar selector electrically coupled in series with the data-storage element and comprising a first unipolar selector and a second unipolar selector, wherein the first and second unipolar selectors are electrically coupled in parallel with opposite orientations;
wherein the reference ferromagnetic element is separated from the bipolar selector by the free ferromagnetic element, wherein the free ferromagnetic element is separated from an anode of the first unipolar selector by a cathode of the first unipolar selector, and wherein a threshold voltage of the first unipolar selector is more than that of the second unipolar selector.

2. The memory cell according to claim 1, wherein the first and second unipolar selectors are diodes.

3. The memory cell according to claim 2, wherein the first unipolar selector has a greater length than the second unipolar selector.

4. The memory cell according to claim 1, wherein the first and second unipolar selectors have different ON resistances in forward biased states.

5. The memory cell according to claim 1, wherein the first unipolar selector has a voltage increasing with current until a first current is reached, wherein the voltage decreases as current increases above the first current until a second current is reached, and wherein the voltage increases with current above the second current.

6. The memory cell according to claim 1, wherein the reference ferromagnetic element has a fixed magnetization, whereas the free ferromagnetic element has a variable magnetization.

7. A memory cell comprising:
a data-storage element having a variable resistance and comprising a magnetic tunnel junction (MTJ), wherein the MTJ comprises a reference ferromagnetic element and a free ferromagnetic element; and
a bipolar selector electrically coupled in series with the data-storage element and comprising a first unipolar selector and a second unipolar selector, wherein the first and second unipolar selectors are electrically coupled in parallel with opposite orientations and respectively comprise a first insulator and a second insulator;
wherein the reference ferromagnetic element is separated from the bipolar selector by the free ferromagnetic element, wherein the free ferromagnetic element is separated from an anode of the first unipolar selector by a cathode of the first unipolar selector, and wherein a thickness of the first insulator is more than a thickness of the second insulator.

8. The memory cell according to claim 7, wherein the first and second unipolar selectors are diodes.

9. The memory cell according to claim 7, wherein the first and second unipolar selectors have different ON resistances in forward biased states.

10. The memory cell according to claim 9, wherein the first unipolar selector has a greater ON resistance than the second unipolar selector in forward biased states.

11. The memory cell according to claim 7, wherein the anode of the first unipolar selector and the cathode of the first unipolar selector respectively underlie and overlie the first insulator, and wherein an anode of the second unipolar selector and a cathode of the second unipolar selector respectively overlie and underlie the second insulator.

12. The memory cell according to claim 7, wherein the first insulator comprises doped hafnium oxide, such that the first unipolar selector has a snapback current-voltage (I-V) curve.

13. The memory cell according to claim 7, wherein the first and second insulators are semiconductor materials.

14. A memory cell comprising:
a data-storage element having a variable resistance and comprising a magnetic tunnel junction (MTJ), wherein the MTJ comprises a reference ferromagnetic element and a free ferromagnetic element vertically stacked; and
a bipolar selector electrically coupled in series with the data-storage element, wherein the bipolar selector comprises a first unipolar selector and a second unipolar selector electrically coupled in parallel with opposite orientations and having different ON resistances, wherein the first unipolar selector comprises a first anode and a first cathode, and wherein the second unipolar selector comprises a second anode and a second cathode;
wherein the first anode has a first orientation relative to the first cathode, wherein the second anode has a second orientation relative to the second cathode, wherein an orientation of the reference ferromagnetic element relative to the free ferromagnetic element is a same as one of the first orientation and the second orientation, and wherein a unipolar selector corresponding to the one of the first orientation and the second orientation has a smallest ON resistance amongst the first and second unipolar selectors.

15. The memory cell according to claim 14, wherein the reference ferromagnetic element is oriented over the free ferromagnetic element, wherein the second anode is oriented over the second cathode, and wherein the second unipolar selector has the smallest ON resistance.

16. The memory cell according to claim 14, wherein the first and second unipolar selectors have different widths, and wherein the unipolar selector corresponding to the one of the first orientation and the second orientation has a greatest width amongst the first and second unipolar selectors.

17. The memory cell according to claim 14, wherein the first and second unipolar selectors have different threshold voltages, and wherein the unipolar selector corresponding to the one of the first orientation and the second orientation has a smallest threshold voltage amongst the first and second unipolar selectors.

18. The memory cell according to claim 14, wherein the first unipolar selector comprises a first insulator vertically stacked between the first anode and the first cathode, wherein the second unipolar selector comprises a second insulator vertically stacked between the second anode and the second cathode, wherein the first and second insulators have different thicknesses, and wherein the unipolar selector corresponding to the one of the first orientation and the second orientation has a smallest insulator thickness amongst the first and second unipolar selectors.

19. The memory cell according to claim 14, wherein the unipolar selector corresponding to the one of the first orientation and the second orientation has a smallest height amongst the first and second unipolar selectors.

20. The memory cell according to claim 14, wherein the first anode, the first cathode, the second anode, and the second cathode comprise metal.

\* \* \* \* \*